United States Patent
Kajigaya et al.

(10) Patent No.: US 7,869,294 B2
(45) Date of Patent: Jan. 11, 2011

(54) SEMICONDUCTOR DEVICE HAVING SINGLE-ENDED SENSING AMPLIFIER

(75) Inventors: Kazuhiko Kajigaya, Tokyo (JP); Soichiro Yoshida, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 123 days.

(21) Appl. No.: 12/382,494

(22) Filed: Mar. 17, 2009

(65) Prior Publication Data

US 2009/0257298 A1 Oct. 15, 2009

(30) Foreign Application Priority Data

Mar. 17, 2008 (JP) ............... 2008-068165
Mar. 16, 2009 (JP) ............... 2009-062365

(51) Int. Cl.
*G11C 7/02* (2006.01)
(52) U.S. Cl. .................. 365/207; 365/205; 365/194
(58) Field of Classification Search ................ 365/207, 365/205, 194
See application file for complete search history.

(56) References Cited

U.S. PATENT DOCUMENTS

| 7,486,565 | B2 | 2/2009 | Edahiro |
| 7,782,697 | B2 * | 8/2010 | Terzioglu et al. ............ 365/207 |
| 2007/0147128 | A1 | 6/2007 | Edahiro |

FOREIGN PATENT DOCUMENTS

JP 2007-172779 7/2007

\* cited by examiner

*Primary Examiner*—Huan Hoang
(74) *Attorney, Agent, or Firm*—McGinn IP Law Group, PLLC

(57) ABSTRACT

A single-ended sense amplifier in a semiconductor storage device having a hierarchical bit line structure includes a first MOS transistor for amplifying a signal outputted from a memory cell to a bit line, a second MOS transistor for feeding the output of the first MOS transistor to a global bit line, and a global bit line voltage determination circuit; and at least the ON/OFF timing of the second MOS transistor or the read timing of a global sense amplifier that includes the global bit line voltage determination circuit is controlled by the output signal of a delay circuit that includes a replica of the first MOS transistor and a replica of the global bit line voltage determination circuit.

24 Claims, 18 Drawing Sheets

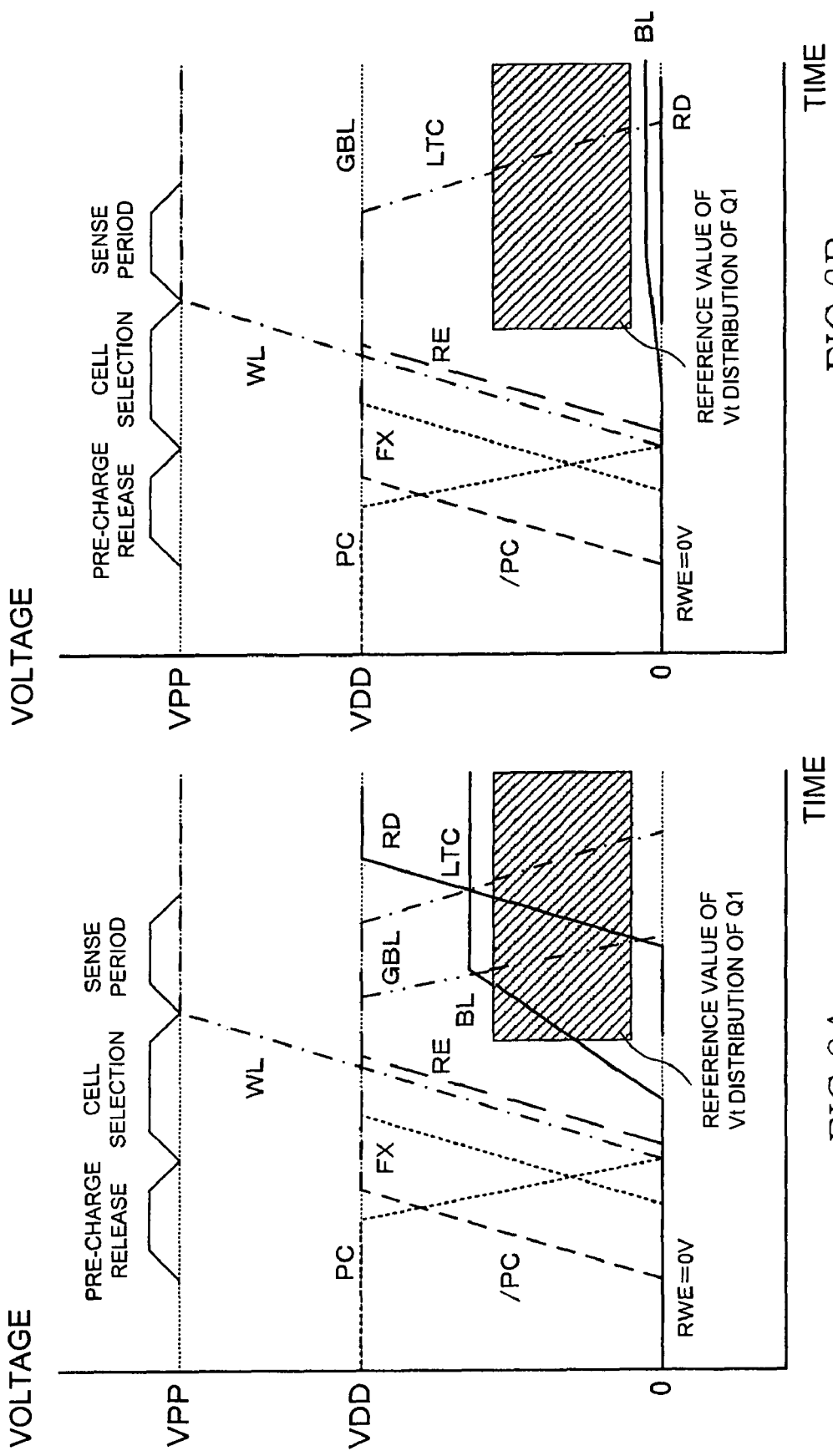

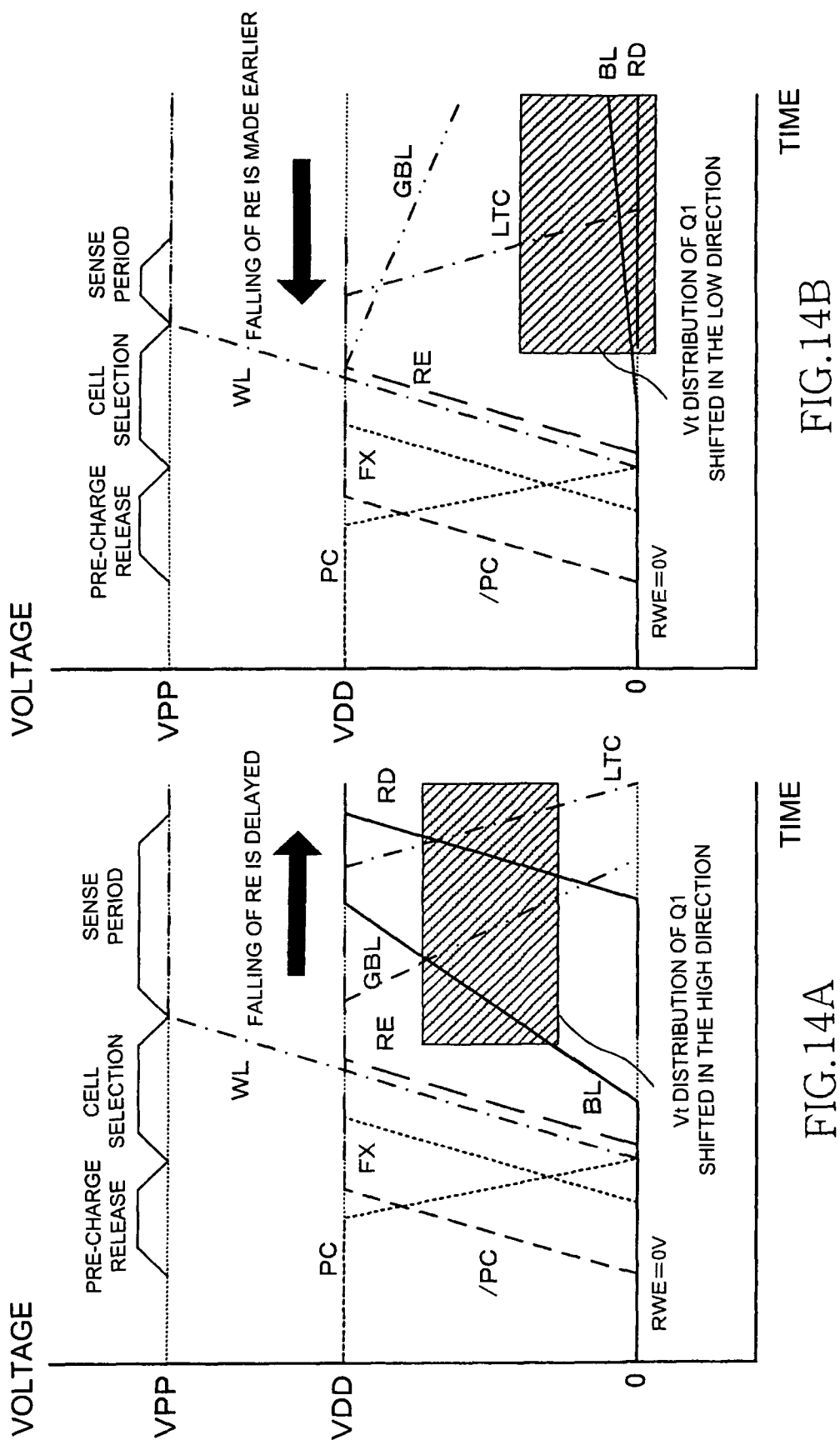

SEMICONDUCTOR DEVICE HAVING SINGLE-ENDED SENSING AMPLIFIER

CROSS REFERENCE TO RELATED APPLICATIONS

This application claims priority, makes reference to, incorporates the same herein, and claims all benefits accruing under 35 U.S.C. §119 from an application for SEMICONDUCTOR DEVICE HAVING SINGLE-ENDED SENSING AMPLIFIER, earlier filed in the Japanese Patent Office on 17 Mar. 2008 and there duly assigned Japanese Patent Application No. 2008-068165, the entire disclosure of which is hereby incorporated by reference in its entirety, and an application for SEMICONDUCTOR DEVICE HAVING SINGLE-ENDED SENSING AMPLIFIER, earlier filed in the Japanese Patent Office on 16 Mar. 2009 and there duly assigned Japanese Patent Application No. 2009-062365, the disclosure of which is hereby incorporated by reference in its entirety.

This application cross references application for commonly-assigned U.S. patent application Ser. No. 12/382,493, entitled Device having Single-Ended Sensing Amplifier filed on Mar. 17, 2009, the entire contents of which is incorporated herein in its entirety, and commonly assigned U.S. patent application Ser. No. 12/382,495, entitled Device having Single-Ended Sensing Amplifier filed on Mar. 17, 2009, the entire contents of which is incorporated herein in its entirety.

BACKGROUND OF THE DISCLOSURE

1. Field of the Disclosure

The disclosure relates to a control circuit of a sense amplifier that is used in a semiconductor device, and particularly relates to a sense amplifier control circuit for suitably compensating for dependence with respect to the manufacturing process, power supply voltage, or junction temperature in a MOS (metal-oxide-semiconductor) transistor that constitutes a sense amplifier; to a sense amplifier control method; and to a data processing system.

2. Description of Related Art

A conventional technique is known that includes a memory cell array in which memory cells are arranged in a matrix, a bit line for connecting the memory cells in the same row in common, a pre-charge circuit for presenting a pre-charge potential to the bit line when data is read, and a first sense amplifier for amplifying the data read to the bit line; wherein the first sense amplifier discriminates between the data read to the bit line using the pre-charge potential presented to the bit line by the pre-charge circuit as a reference potential (see Japanese Patent Application Laid-Open No. 2007-172779, for example).

SUMMARY

However, the technique described above has drawbacks in that the threshold voltage or the "on" current of the MOS transistor constituting the sense amplifier varies due to the manufacturing process, the power supply voltage, the junction temperature, and other factors, and since this variation causes the size of the drain current to vary, the operating margin of the sense amplifier is reduced.

The disclosure was therefore developed in view of the drawbacks described above, and an object of the disclosure is to provide a sense amplifier control circuit for compensating for the manufacturing process, the power supply voltage, the junction temperature, and other factors that cause variation, and preventing the operating margin of the sense amplifier from decreasing; and to provide a sense amplifier control method and a data processing system.

The disclosure for overcoming the abovementioned drawbacks includes the aspects described below.

(1) The disclosure provides a semiconductor device of a single-ended sense amplifier including at least a first field-effect transistor for amplifying a signal supplied to a bit line from a memory cell, a second field-effect transistor for supplying an output signal of the first field-effect transistor to a global bit line, and a global bit line voltage determination circuit; and a control circuit for controlling at least a timing at which the second field-effect transistor transitions from a conducting state to an non-conducting state or a read timing of a global sense amplifier that includes the global bit line voltage determination circuit, based on an output signal of a delay circuit that includes a replica of the first field-effect transistor and a replica of the global bit line voltage determination circuit.

(2) The disclosure also provides a semiconductor device comprising a memory element for storing information; a third field-effect transistor for connecting the memory element to a bit line; a first field-effect transistor that works as a single-ended sense amplifier including a gate connected to the bit line for amplifying a data signal on the bit line; a second field-effect transistor connected to the first field-effect transistor for supplying an output signal of the first field-effect transistor to a global bit line; a global bit line voltage determination circuit connected to the global bit line for determining a signal on the global bit line; a delay circuit that includes a replica of the first field-effect transistor and a replica of the global bit line voltage determination circuit; and a control circuit for controlling at least a timing at which the second field-effect transistor transitions from a conducting state to an non-conducting state based on an output signal of the delay circuit.

According to the disclosure, changes in the electrical characteristics of the MOS transistor for sense amplification that accompany dependence on variations in the manufacturing process, the power supply voltage, and the junction temperature (hereinafter collectively abbreviated as PVT) are compensated for. The operating margin of the sense amplifier is therefore enhanced, and the memory sense operation is stabilized. From the opposite perspective, since the allowable range of variations in the manufacturing of MOS transistors can be increased, the manufacturing yield is enhanced for memory that uses numerous sense amplifiers, such as high-capacity DRAM to which the disclosure is applied, and the manufacturing cost can also be reduced.

Besides MOS transistors, the PVT variation dependence of the latch for determining the global bit line voltage, or the MOS transistor for memory cell selection is monitored, and variations due to dependence thereof are compensated for. The effects described above can therefore be even more significantly demonstrated. Since the allowable range of variation in the manufacturing of MOS transistors can also be enlarged, memory can also be provided that is adapted for miniaturization and an increased degree of integration.

BRIEF DESCRIPTION OF THE DRAWINGS

The above features and advantages of the disclosure will be more apparent from the following description of certain preferred example embodiments taken in conjunction with the accompanying drawings, in which:

FIG. 8 is a diagram showing the operational waveform of the PVT variation compensation sense amplifier according to the present embodiment in which the LTC signal replica delay circuit is mounted in a case in which there is no PVT variation;

FIG. 14 is a diagram showing the operational waveform of the PVT variation compensation sense amplifier in which the LTC signal replica delay circuit is mounted in a case in which the resistance-change memory cell according to Modification 1 is used, and there is PVT variation;

DESCRIPTION OF THE PREFERRED EMBODIMENTS

Embodiments of the disclosure will be described in detail hereinafter with reference to the accompanying drawings.

The constituent elements in the embodiments described herein can be substituted with existing constituent elements and the like, and various variations including combinations with other existing constituent elements are also possible. The scope of the disclosure as described in the claims is thus not limited by the embodiments described herein.

Embodiment 1

Embodiments of the disclosure will now be described using FIGS. 1 through 9.

<Overall Structure>

Figure 1:
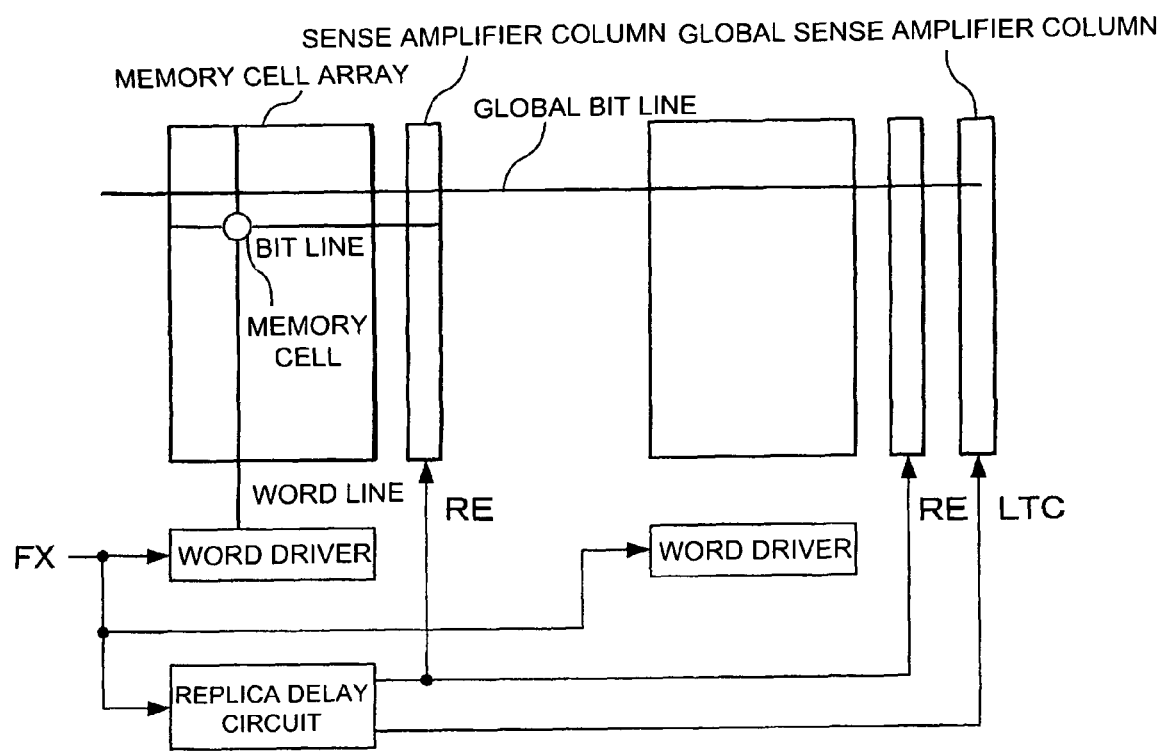
FIG. 1 is a diagram showing the overall circuit structure of the memory sense system according to the present example embodiment.

FIG. 1 is a circuit block diagram showing the overall structure of the memory sense system as an embodiment of the disclosure.

As shown in FIG. 1, a plurality of units that include a memory cell array and a sense amplifier column is arranged in the bit line direction. Each memory array includes a plurality of word lines, a plurality of bit lines (local bit lines), and a plurality of memory cells arranged at the junctions of the word lines and bit lines. The bit lines are connected to a corresponding sense amplifier, and the sense amplifier amplifies a signal read to a bit line from a memory cell selected by a word line, and outputs the signal to a global bit line.

A global sense amplifier column is aligned with respect to a plurality of pairs of memory cell arrays and sense amplifier columns. A configuration of hierarchical bit lines and hierarchical sense amplifiers is thus adopted in the memory sense system of the present embodiment. The reference symbol FX refers to a word line drive timing signal that is inputted to a replica delay circuit at the same time as being inputted to a word driver and turning on the selected word line. The replica delay circuit receives the FX signal, and specifies the operating period of the sense amplifier or the global sense amplifier as described hereinafter.

<Structure of the Memory Cell and Sense Amplifier>

Figure 2:
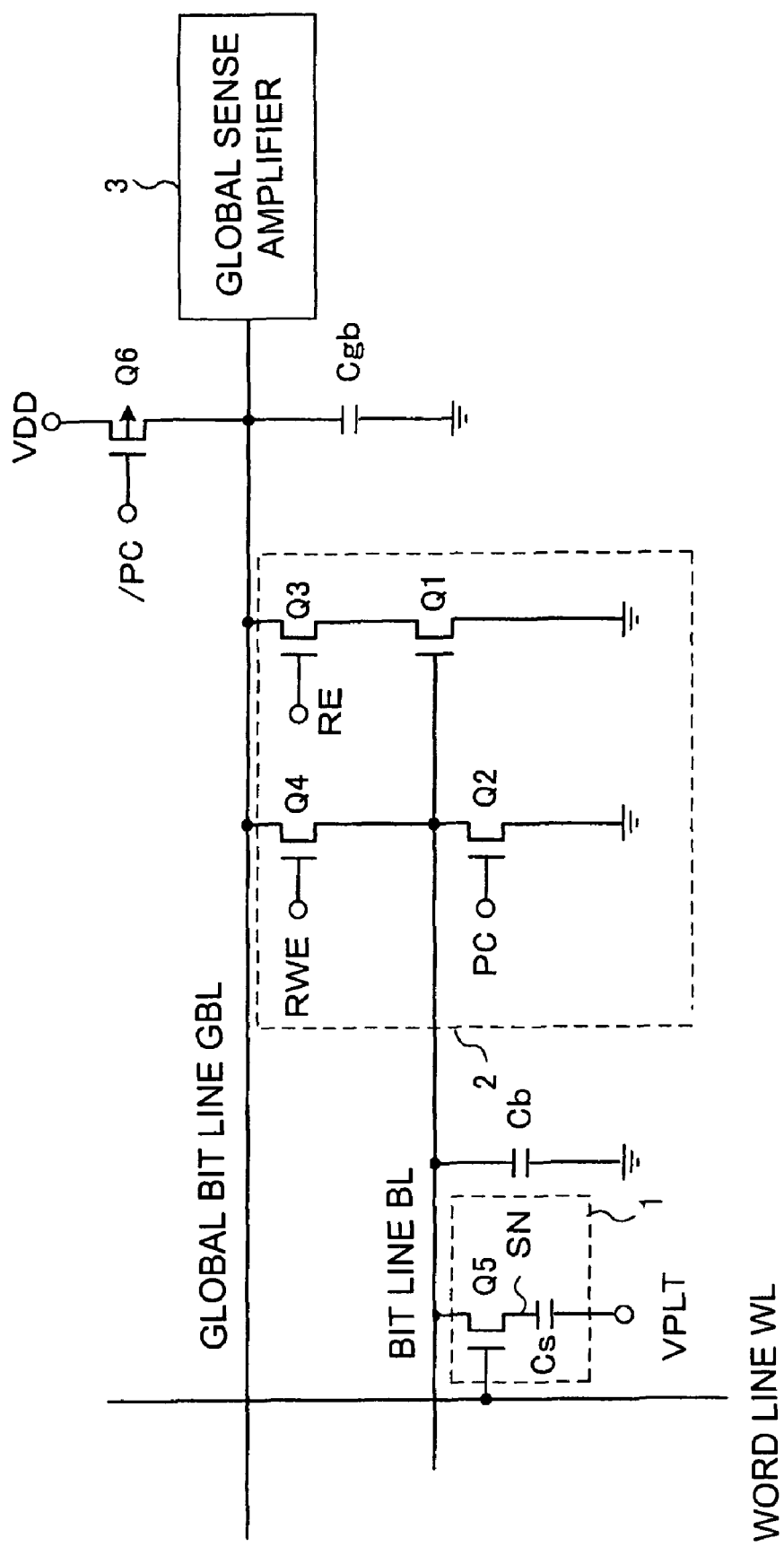
FIG. 2 is a diagram showing the structure of the DRAM memory cell and sense amplifier according to the present embodiment.

FIG. 2 is a diagram showing the specific circuits of the DRAM (Dynamic Random Access Memory) memory cell array and sense amplifier shown in FIG. 1.

FIG. 2 shows a word line WL, a bit line BL, a memory cell 1 arranged at the junction of the word line WL and the bit line BL, a sense amplifier 2, a global bit line GBL, and a global sense amplifier 3.

The configuration of the present embodiment is a technique relating to a single-ended sense amplifier in which a single signal is inputted, only one signal is amplified, and the amplified signal is outputted. A common differential sense amplifier has a higher gain than a single-ended sense amplifier and is also more resistant to noise. The high gain of a differential sense amplifier also reduces the time taken to vary the amplified output signal. On the other hand, a single-ended sense amplifier is extremely sensitive to noise, and requires a higher input signal in order to generate an amplified output. The aforementioned sense amplifier connected to the bit line is a single-ended sense amplifier.

The selection transistor Q3 is a control signal for connecting the global bit line and the output of the amplifier, but the control signal may also include an address signal or other selection information for selecting a plurality of local bit lines and a single global bit line. In general, since numerous memory cells and sense amplifier 2 are connected to a local bit line BL to form a memory array, the wiring pitch of the local bit line BL is equal to or smaller than the wiring pitch of the global bit line GBL.

A "single-ended sense amplifier (sense amplifier 2) for first amplifying the information of the memory cell 1, which is the data signal, via a local bit line" is connected to the hierarchical bit line structure. The sense amplifier 2 includes an amplifier Q1 that is a single-ended sense amplifier, and a selection transistor Q3 for reading that connects the output of the amplifier 2 to the global bit line GBL.

Furthermore, in the disclosure, the voltage (pre-charge voltage) for controlling the bit line prior to accessing of the memory cell is controlled by a common internal voltage (e.g., an internal power supply voltage that is stepped down from an external power supply) for driving the memory cell, a VSS (negative or ground potential) power supply, or another voltage, rather than through the use of the bit line ½ pre-charge scheme (in which the bit line control voltage prior to accessing of the memory cell is controlled to a ½ voltage that is in between relative voltages that correspond to information 1 and information 0) that has come to be used in DRAM and the like. For example, a characteristic feature of the embodiments is that the bit line voltage after the memory cell is accessed is transitioned in one direction (of the VSS or the internal power supply voltage) from the internal power supply voltage or the predetermined potential of the VSS, regardless of whether the memory cell information is "1" or "0." In a semiconductor device in which the voltages of the external power supply and internal power supply of the semiconductor device are lowered to near 1 V (a voltage that is near the limit of the operating point at which a CMOS-type sense amplifier operates), the control voltage of the bit line combines with a sensing scheme that utilizes the single-ended sense amplifier to produce enhanced synergistic effects of higher speed and stability, and circuit stability due to variations in manufacturing conditions.

The bit line BL is connected to the gate of an nMOS (n-type channel metal-oxide-semiconductor) transistor Q1 constituting the sense amplifier, and a signal voltage read to the bit line BL is sensed/amplified and converted to a drain current. A pre-charge signal PC is inputted to the gate of a bit line pre-charge nMOS transistor Q2, and the bit line BL is pre-charged to a ground potential VSS when PC is in a high state.

It is sufficient insofar as the transistor is a field-effect transistor (FET), and besides a MOS (Metal Oxide Semiconductor), the disclosure can also be applied to a MIS (Metal-Insulator Semiconductor) transistor and various other FETs. An NMOS transistor (N-type-channel MOS transistor) is a typical example of a first-conductivity-type transistor, and PMOS transistor (P-type-channel MOS transistor) is a typical example of a second-conductivity-type transistor.

A selection signal RE is received by the gate of a sense amplifier read selection nMOS transistor Q3, and when the selection signal RE is high, the nMOS transistor Q3 is placed in a conducting state, and the global bit line GBL and the drain of the nMOS transistor Q1 that is the output node of the sense amplifier are selectively connected. A selection signal RWE is received by the gate of a sense amplifier write selection nMOS transistor Q4, and when the selection signal RWE is high, the nMOS transistor Q4 is placed in a conducting state, and the bit line BL and the global bit line GBL are selectively connected.

It is sufficient insofar as the nMOS transistor Q3 and the nMOS transistor Q1 are connected in series, and the sequential relation thereof is essentially unlimited. Ideally, since a large number of nMOS transistors Q3 are connected to the global bit line GBL, the nMOS transistor Q3 should be connected on the side of the global bit line GBL as shown in FIG. 1 when the low noise effects of the global bit line GBL are emphasized.

A plurality of bit lines BL and a plurality of memory cells are connected to the global bit line GBL via a plurality of other sense amplifiers not shown in the drawing, and at the time of a read operation, the nMOS transistor Q3 connects to the global bit line GBL only the sense amplifier to which the selected memory cell belongs. As a result, the nMOS transistor Q1 drives the global bit line GBL in accordance with the signal read to the bit line BL, and the global sense amplifier 3 latches the signal transferred to the global bit line GBL and outputs to an external circuit (not shown).

At the time of a write operation, the nMOS transistor Q4 connects to the global bit line GBL, and only the sense amplifier to which the selected memory cell belongs. When the global sense amplifier 3 receives write data from an external circuit (not shown) and drives the global bit line GBL, the bit line BL is driven via the nMOS transistor Q4, and this results in data being written to the memory cell.

The memory cell 1 is composed of a selection nMOS transistor Q5 and a capacitor Cs for storing data by an amount of accumulated charge. The gate of the nMOS transistor Q5 is connected to the word line WL, the drain is connected to the bit line BL, and the source is connected to one terminal of the capacitor Cs. The other terminal of the capacitor Cs is connected to a cell plate potential VPLT.

A plurality of other memory cells not shown in the drawing is connected to the bit line BL, and as a result, the parasitic capacitance Cb of the bit line BL in the present embodiment is 10 fF, for example. Although not particularly specified, the capacitance of the capacitor Cs of the present embodiment is 20 fF. As a result, a signal voltage is read to the bit line BL by charge sharing in the system composed of the capacitor Cs and the bit line parasitic capacitance Cb.

Consequently, during reading, since an adequate difference in the potential of the bit line BL several ns after the nMOS transistor Q5 turns on and charge sharing is initiated is produced by the presence of an accumulated charge in the capacitor, a sense amplification operation can be executed by the nMOS transistor Q1 with a margin by setting the sense period within this several ns. The number of memory cells connected to the bit line BL may be set in accordance with the operating principle described above so that the necessary signal voltage is obtained by charge sharing.

A global bit line pre-charge pMOS transistor Q6 receives the inverse signal /PC of the pre-charge signal PC at the gate thereof, and the global bit line GBL is pre-charged to the power supply potential VDD when /PC is in a low state. The parasitic capacitance of the global bit line is indicated as Cgb.

<Structure of the Global Sense Amplifier>

Figure 3:
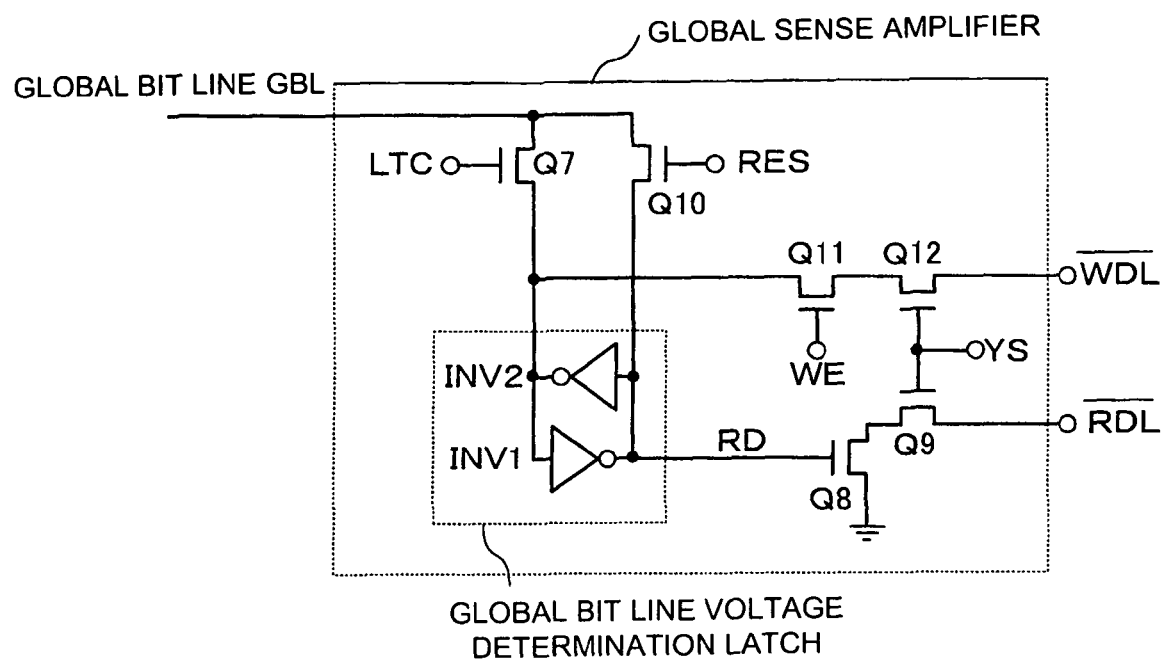
FIG. 3 is a diagram showing the circuit structure of the global sense amplifier according to the present embodiment.

FIG. 3 is a diagram showing the specific circuits of the global sense amplifier shown in FIG. 2.

During reading in the global sense amplifier 3, LTC changes to high, the nMOS transistor Q7 turns on (conducting), and the signal voltage read to the global bit line GBL is determined to be high or low by a global bit line voltage determination latch composed of inverters INV1 and INV2.

An nMOS transistor Q7 used during reading of the memory cell data, and an nMOS transistor Q11 for inputting write data during writing to the memory cell from the outside (outside the semiconductor device) are connected to the input side of the global bit line voltage determination latch.

An nMOS transistor Q8 used during reading, and an nMOS transistor Q10 for connecting write data to the global bit line during writing are connected to the output side of the global bit line voltage determination latch. The nMOS transistor Q10 is also used in a rewriting operation for writing the data (data read from the memory cell) of the global bit line voltage determination latch back to the memory cell during reading.

A voltage that is the inverse of the logical value of the global bit line GBL is obtained in the output RD of the global bit line voltage determination latch, and when the global sense amplifier selection signal YS is high, the voltage is outputted to a read signal line /RDL through a read circuit that is composed of a series circuit of an nMOS transistor Q8 and an nMOS transistor Q9.

After the voltage of RD is established, the nMOS transistor Q7 turns off (non-conducting) and the nMOS transistor Q10 turns on (conducting) when LTC changes to low and RES changes to high, and INV1 drives the global bit line GBL by the data of RD, whereby the bit line is driven by rewrite data through the aforementioned nMOS transistor Q4, and the accumulated charge of the memory cell is rewritten.

During writing, LTC changes to low, RES changes to high, and the write signal WE changes to high, and the nMOS transistor Q7 turns off, the nMOS transistor Q10 turns on, and an nMOS transistor Q11 turns on. In this arrangement, when the global sense amplifier selection signal YS is high, an nMOS transistor Q12 turns on, the global bit line GBL is driven by the data of a write signal line /WDL through the path of the nMOS transistor Q12, the nMOS transistor Q11, INV1, and the nMOS transistor Q10, the bit line is driven by write data through the aforementioned nMOS transistor Q4, and the accumulated charge is written to the memory cell.

<Structure of the Replica Delay Circuit for the RE Signal>

Figure 4:
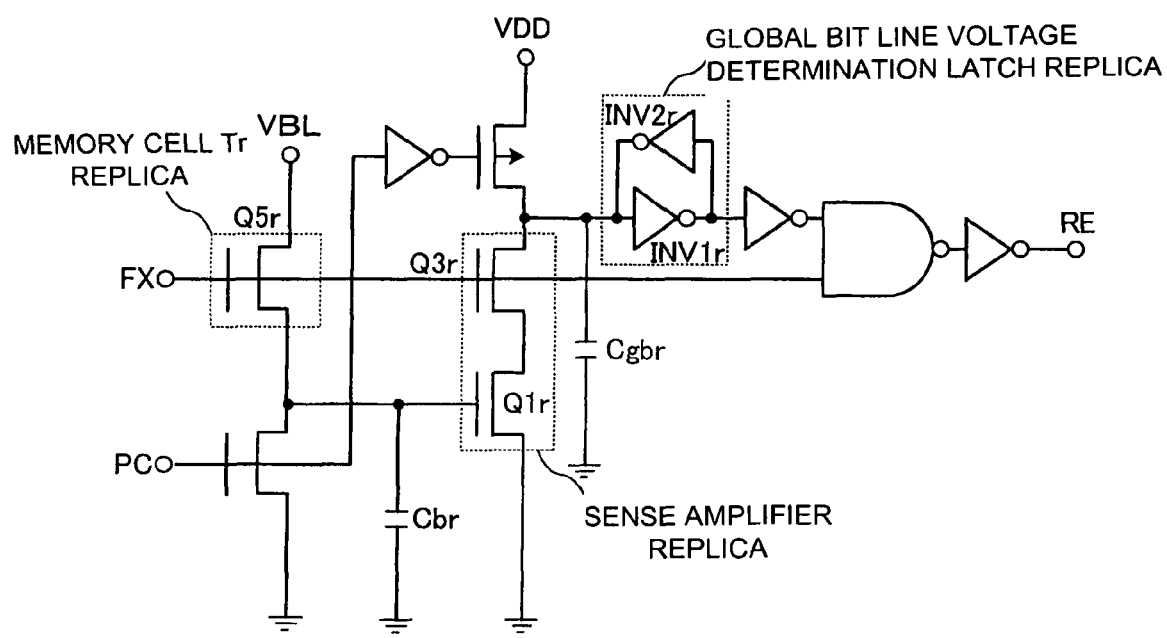
FIG. 4 is a diagram showing the structure of the replica delay circuit for the RE signal according to the present embodiment.

FIG. 4 is a diagram showing, as an embodiment in FIG. 1, the replica delay circuit for generating the RE signal.

During pre-charging, PC is high and FX is low in this circuit. Therefore, RE is low, the bit line replica capacitance Cbr is discharged to the ground voltage, and the global bit line replica capacitance Cgbr is charged to VDD (positive potential).

During reading, PC changes to low, and then FX changes to high, whereupon RE immediately changes to high. Since a replica is not included in this path, there is no subject for PVT compensation, but no problems are presented by this in the operation of the sense amplifier of the present embodiment.

When FX changes to high, the replica Q3r of the sense amplifier nMOS turns on, the replica Q5r of the memory cell selection nMOS transistor turns on, and the bit line replica capacitance Cbr is charged by the power supply VBL. The VBL herein can be set to any positive voltage in order to optimize the characteristics of the replica delay circuit.

When the bit line replica capacitance Cbr is charged by the power supply VBL, the sense amplifier nMOS replica Q1r turns on, and the global bit line replica capacitance Cgbr is discharged to the ground potential. In this process, when the replica of the global bit line voltage determination latch determines that the input voltage is "low," the output inverts, and RE changes to low.

Since the path in which RE changes to low includes the memory cell selection nMOS transistor replica Q5r, the sense amplifier nMOS transistor replicas Q1r and Q3r, the replica of the global bit line voltage determination latch, the bit line replica capacitance Cbr, and the global bit line replica capacitance Cgbr, the timing at which RE changes to low reflects the PVT variation dependence of the operation timing of the memory cell 1 and the sense amplifier system, and varies in the same manner.

<Operational Waveform of the PVT Variation Compensation Sense Amplifier in which the Replica Delay Circuit for the RE Signal is Mounted when there is No PVT Variation>

FIG. 5 is a diagram showing the operational waveform of the PVT compensation sense amplifier during reading.

Figures 5A, 5B:
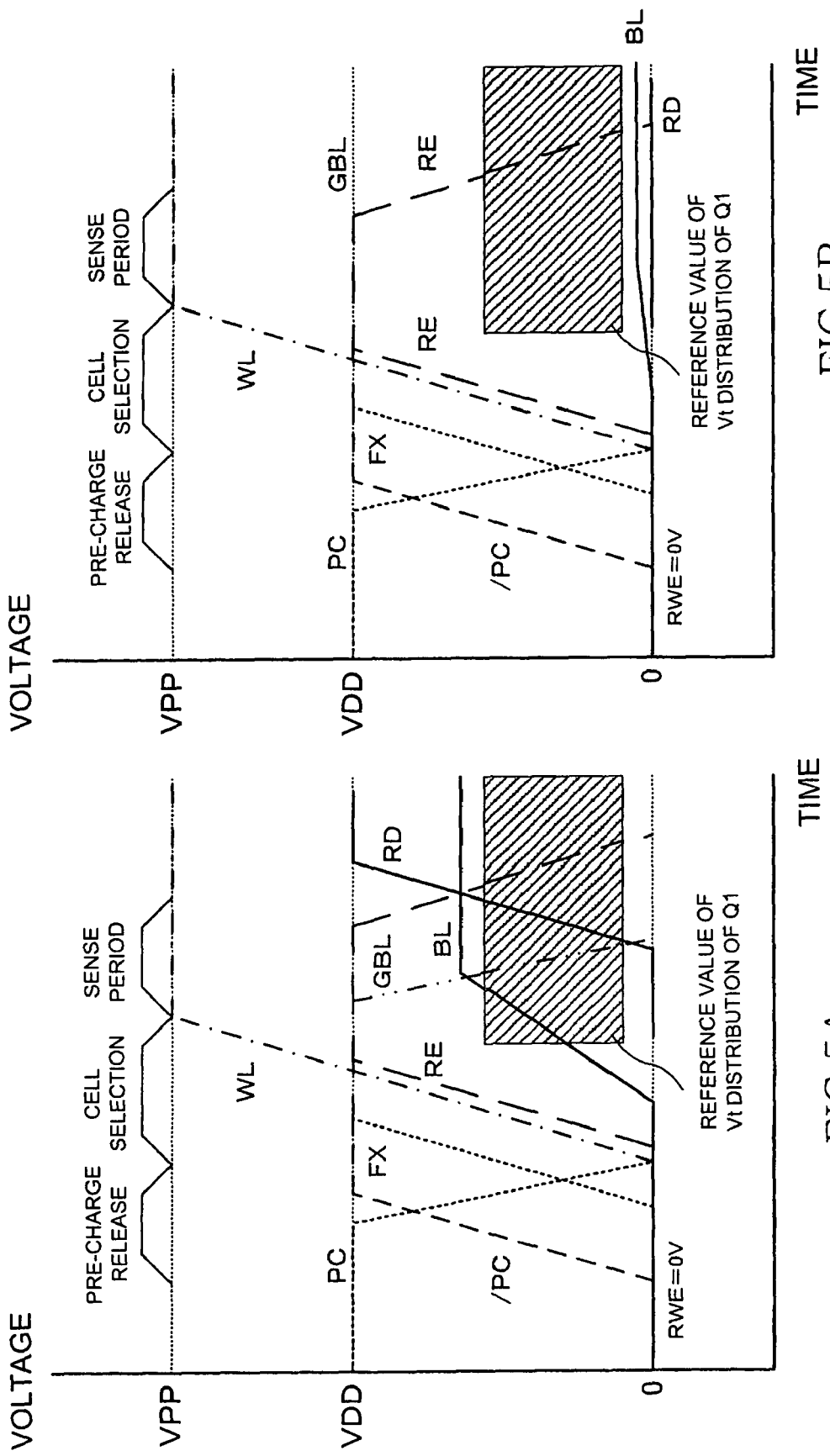
FIG. 5 is a diagram showing the operational waveform of the PVT variation compensation sense amplifier according to the present embodiment in which the RE signal replica delay circuit is mounted in a case in which there is no PVT variation.

The horizontal axis indicates time, and the vertical axis indicates voltage. FIG. 5A shows a case in which high ["H"] data are read from the memory cell, and FIG. 5B shows a case in which low ["L"] data are read.

First, when high data are read, PC is low and /PC is high during the pre-charge release period, the nMOS transistor Q2 and the pMOS transistor Q6 each turn off, the bit line BL is kept floating at 0 V (volts), and the global bit line GBL is kept pre-charged to VDD.

Then, when the cell selection period occurs, FX changes to high, and when WL and RE have changed to high, a "high" signal voltage is read to the bit line from the memory cell 1, and the sense period begins. In the sense period, since the potential of the bit line is higher than the upper limit of the distribution of the threshold voltage Vt of the nMOS transistor Q1, the drain current of the nMOS transistor Q1 is large, and the charge charged by the parasitic capacitance Cgb of the global bit line GBL withdraws rapidly. The potential of the global bit line GBL therefore rapidly discharges from VDD to the ground potential.

This change in potential is determined as low by the global bit line voltage determination latch circuit and inverted, and RD changes to high. This sense period is ended by RE changing to low and the bit line BL and global bit line GBL being disconnected. The distribution of the threshold voltage Vt of the nMOS transistor Q1 indicates the range of variation of the threshold voltage due to such factors as dimensional variation at the time of manufacturing, variation of the gate insulation film thickness, and fluctuation of the channel impurity distribution.

In the case of reading low data, PC is first low and /PC is high in the pre-charge release period, the nMOS transistor Q2 and the PMOS transistor Q6 each turn off, the bit line BL is kept floating at 0 V, and the global bit line GBL is kept pre-charged to VDD.

Then, when the cell selection period occurs, FX changes to high, and when WL and RE have changed to high, a "low" signal voltage is read to the bit line from the memory cell 1, and the sense period begins. During the sense period, since the potential of the bit line is lower than the lower limit of the distribution of the threshold voltage Vt of the nMOS transistor Q1, the drain current of the nMOS transistor Q1 does not flow, there is no withdrawal of the charge that is charged by the parasitic capacitance Cgb of the global bit line GBL, and the potential of the global bit line GBL stays at VDD. As a result, a determination of "high" is made by the global bit line voltage determination latch circuit, and the RD of the inverted data remains low. This sense period is ended by RE changing to low and the bit line BL and global bit line GBL being disconnected.

<Operational Waveform of the PVT Variation Compensation Sense Amplifier in which the Replica Delay Circuit for the RE Signal is Mounted when there is PVT Variation>

Figures 6A, 6B:
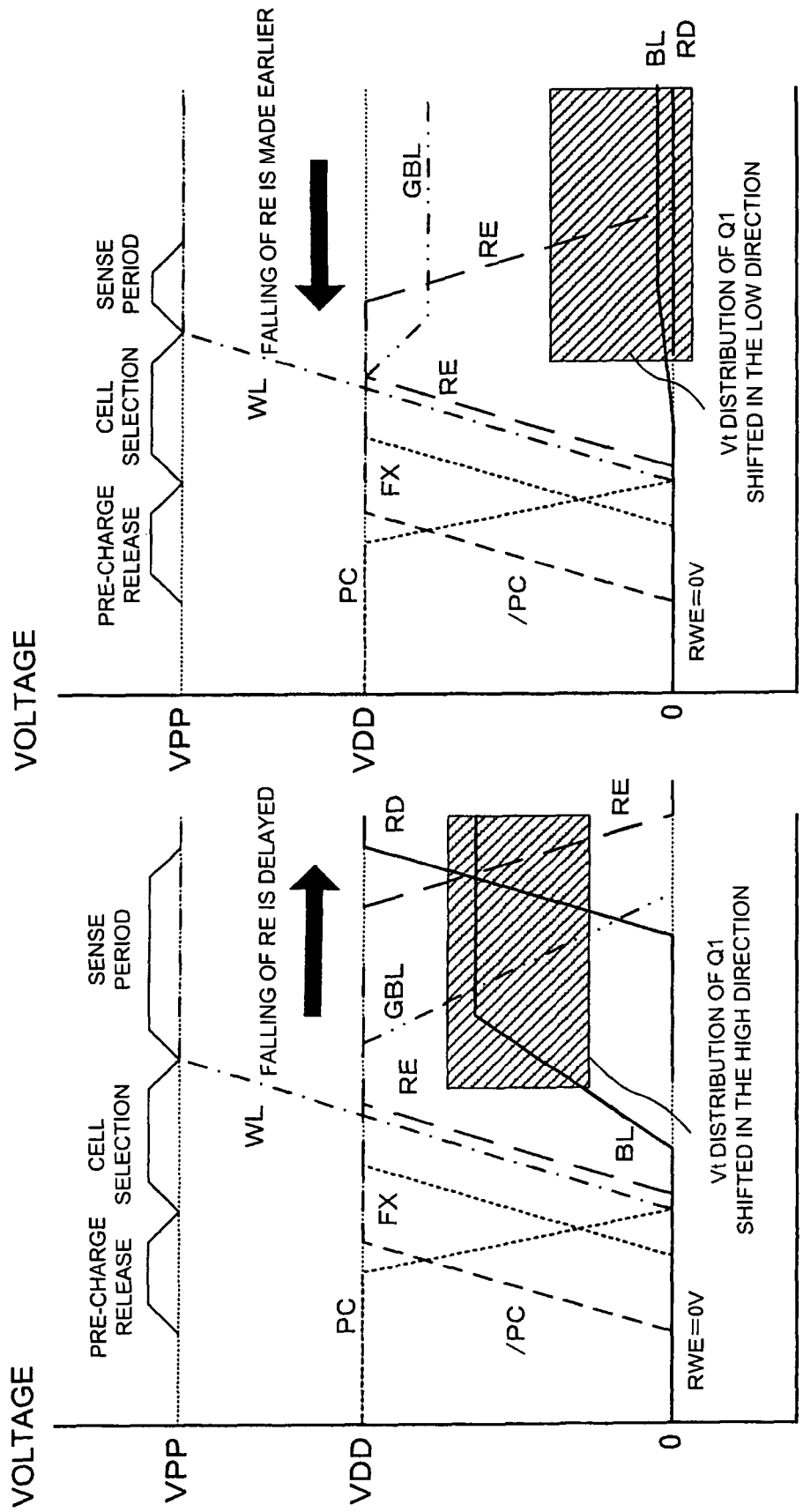
FIG. 6 is a diagram showing the operational waveform of the PVT variation compensation sense amplifier according to the present embodiment in which the RE signal replica delay circuit is mounted in a case in which there is PVT variation.

FIG. 6 is a diagram showing the operation when the Vt distribution of the nMOS transistor Q1 is shifted by PVT variation in the operational waveform of the PVT compensation sense amplifier shown in FIG. 5 during reading. FIG. 6A shows a case of reading high ["H"] data from the memory cell at the worst sense timing margin when Vt is shifted in the high direction. FIG. 6B shows a case of reading low ["L"] data at the worst sense timing margin when Vt is shifted in the low direction. Since the basic operation is the same as in FIG. 5, only the parts that differ from the case of FIG. 5 will be described below.

When the Vt of the nMOS transistor Q1 is shifted in the high direction, and high data are read, since the potential of the bit line in the sense period is lower than the upper limit of the distribution of the threshold voltage Vt of the nMOS transistor Q1, the drain current of the nMOS transistor Q1 decreases, and the charge that is charged by the parasitic capacitance Cgb of the global bit line GBL withdraws at a low rate. As a result, since the rate at which the potential of the global bit line GBL is discharged from VDD to the ground potential is also low, the timing at which a determination of "low" is made by the global bit line voltage determination latch circuit is also delayed. At this time, since the timing at which RE changes to low is appropriately delayed by the replica delay circuit, RE changes to low after the global bit line voltage determination latch circuit makes a determination of "low." Consequently, high reading is correctly determined.

When the Vt of the nMOS transistor Q1 is shifted in the low direction, and low data are read, since the potential of the bit line in the sense period is higher than the lower limit of the distribution of the threshold voltage Vt of the nMOS transistor Q1, the drain current of the nMOS transistor Q1 flows to a certain degree, and the charge that is charged by the parasitic capacitance Cgb of the global bit line GBL withdraws. As a result, the potential of the global bit line GBL is discharged from VDD to the ground potential, and the period in which a determination of "high" is made by the global bit line voltage determination latch circuit is shortened. At this time, since the timing at which RE changes to low is made appropriately early by the replica delay circuit, RE changes to low before an erroneous determination of "low" is made by the global bit line voltage determination latch circuit, and low reading is correctly determined.

<Structure of the LTC Signal Replica Delay Circuit>

Figure 7:
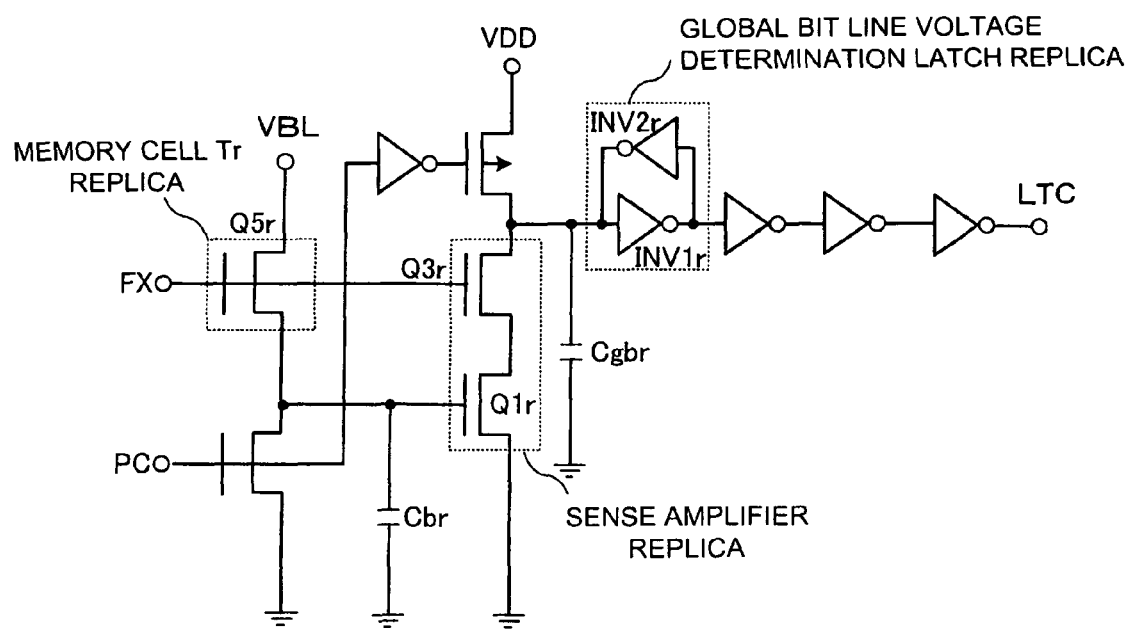
FIG. 7 is a diagram showing the structure of the LTC signal replica delay circuit according to the present embodiment.

FIG. 7 is a diagram showing the replica delay circuit for generating the LTC signal in FIG. 1.

At the time of pre-charging, this circuit is in a state in which PC is high, FX is low, LTC is high, the bit line replica capacitance Cbr is discharged to the ground potential, and the global bit line replica capacitance Cgbr is charged to VDD.

During reading, PC changes to low, and then FX changes to high, whereupon the sense amplifier nMOS transistor replica Q3r turns on, the memory cell selection nMOS transistor replica Q5r turns on, and the bit line replica capacitance Cbr is charged by the power supply VBL. The VBL herein can be set to any positive voltage in order to optimize the characteristics of the replica delay circuit.

When the bit line replica capacitance Cbr is charged by the power supply VBL, the sense amplifier nMOS transistor replica Q1r turns on, and the global bit line replica capacitance Cgbr discharges to the ground potential. In this process, when the replica of the global bit line voltage determination latch determines that the input voltage is "low," the output inverts, and LTC changes to low. Since the path in which LTC changes to low includes the memory cell selection nMOS transistor replica Q5r, the sense amplifier nMOS transistor replicas Q1r and Q3r, the replica of the global bit line voltage determination latch, the bit line replica capacitance Cbr, and the global bit line replica capacitance Cgbr, the timing at which LTC changes to low reflects the PVT variation dependence of the operation timing of the memory cell 1 and the sense amplifier system, and varies in the same manner.

<Operational Waveform of the PVT Variation Compensation Sense Amplifier in which the Replica Delay Circuit for the LTC Signal is Mounted when there is No PVT Variation>

FIG. 8 is a diagram showing the operational waveform of the PVT compensation sense amplifier during reading.

The horizontal axis indicates time, and the vertical axis indicates voltage. FIG. 8A shows a case in which high ["H"] data are read from the memory cell, and FIG. 8B shows a case in which low ["L"] data are read. Except for the presence of the RE falling timing and the LTC, the basic operation of FIG. 8 is the same as in FIG. 5, and parts that have already been described will not be described again.

In the case of reading high data, the sense period is ended by the LTC changing to low, and the global bit line GBL and global bit line voltage determination latch circuit being disconnected. The same applies in the case of reading low data, and the sense period is ended by the LTC changing to low, and the global bit line GBL and global bit line voltage determination latch circuit being disconnected.

<Operational Waveform of the PVT Variation Compensation Sense Amplifier in which the Replica Delay Circuit for the LTC Signal is Mounted when there is PVT Variation>

FIG. 9 is a diagram showing the operation in a case in which the Vt distribution of the nMOS transistor Q1 is shifted by PVT variation in the operational waveform of the PVT compensation sense amplifier during reading.

Figures 9A, 9B:
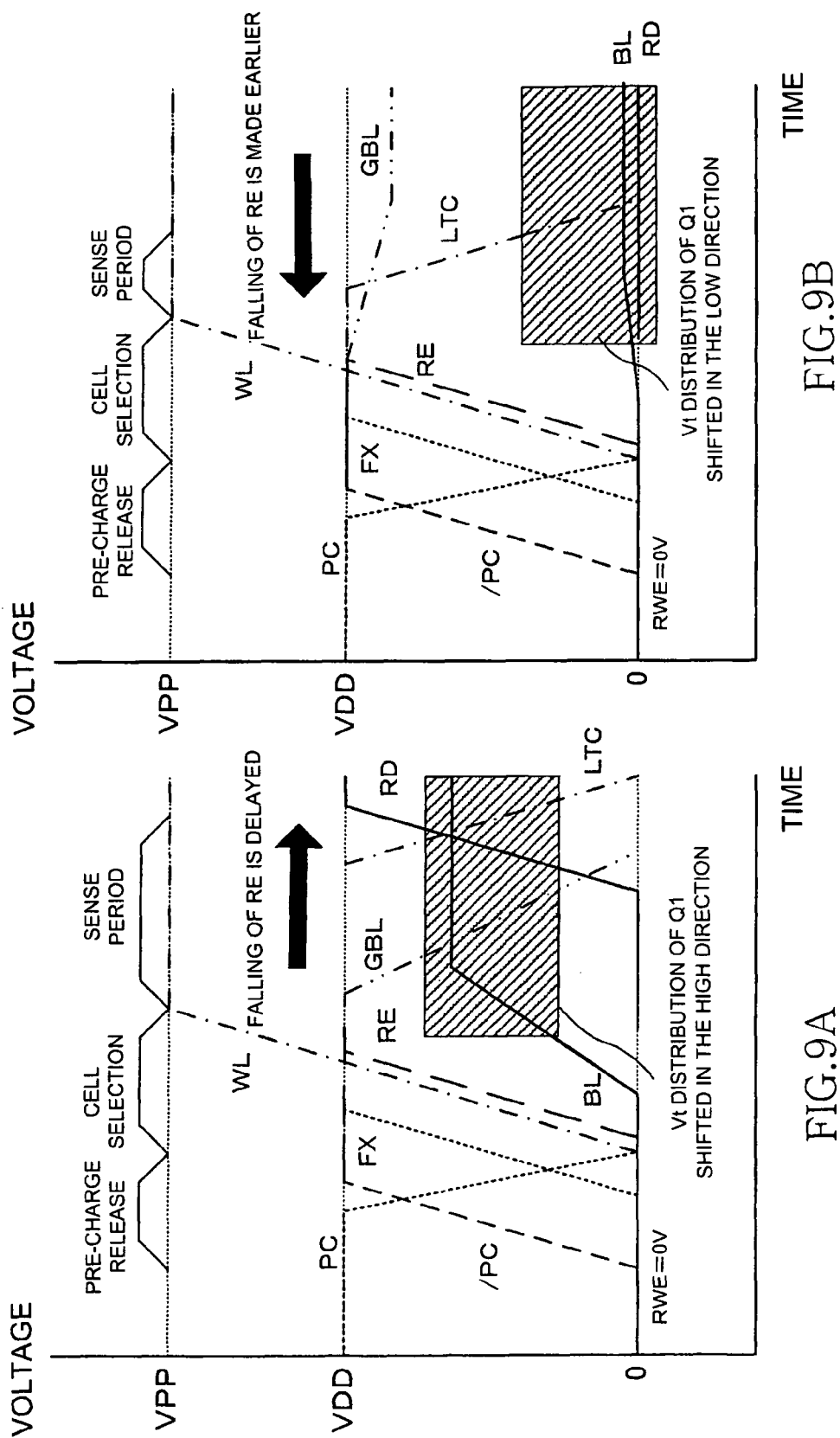
FIG. 9 is a diagram showing the operational waveform of the PVT variation compensation sense amplifier according to the present embodiment in which the LTC signal replica delay circuit is mounted in a case in which there is PVT variation.

FIG. 9A shows a case of reading high ["H"] data from the memory cell 1 at the worst sense timing margin when Vt is shifted in the high direction. FIG. 9B shows a case of reading low ["L"] data at the worst sense timing margin when Vt is shifted in the low direction. Since the basic operation is the same as in FIG. 8, only the parts that differ from the case of FIG. 8 will be described below.

When the Vt of the nMOS transistor Q1 is shifted in the high direction, and high data are read, since the timing at which LTC changes to low is appropriately delayed by the replica delay circuit, LTC changes to low after the global bit line voltage determination latch circuit makes a determination of "low," and high reading is correctly determined. When the Vt of the nMOS transistor Q1 is shifted in the low direction, and low data are read, since the timing at which LTC changes to low is made appropriately early by the replica delay circuit, LTC changes to low before an erroneous determination of "low" is made by the global bit line voltage determination latch circuit, and low reading is correctly determined.

The description given above relates to the structure and operation of the replica delay circuit for the RE signal, and the replica delay circuit for the LTC signal in order to compensate for PVT variation, but these circuits do not necessarily operate together, and PVT variation can be adequately compensated for by operating only one of these circuits.

Consequently, according to the present embodiment, changes in the electrical characteristics of a MOS transistor for sense amplification that accompany dependence on PVT variations are compensated for. The operating margin of the sense amplifier is therefore enhanced, and the memory sense operation is stabilized. Besides MOS transistors, the PVT variation dependence of the latch for determining the global bit line voltage in the global sense amplifier, or the MOS transistor for memory cell selection is monitored, and variations due to dependence thereof are compensated for. The effects described above can therefore be even more significantly demonstrated.

<Modification 1>

Figure 10:
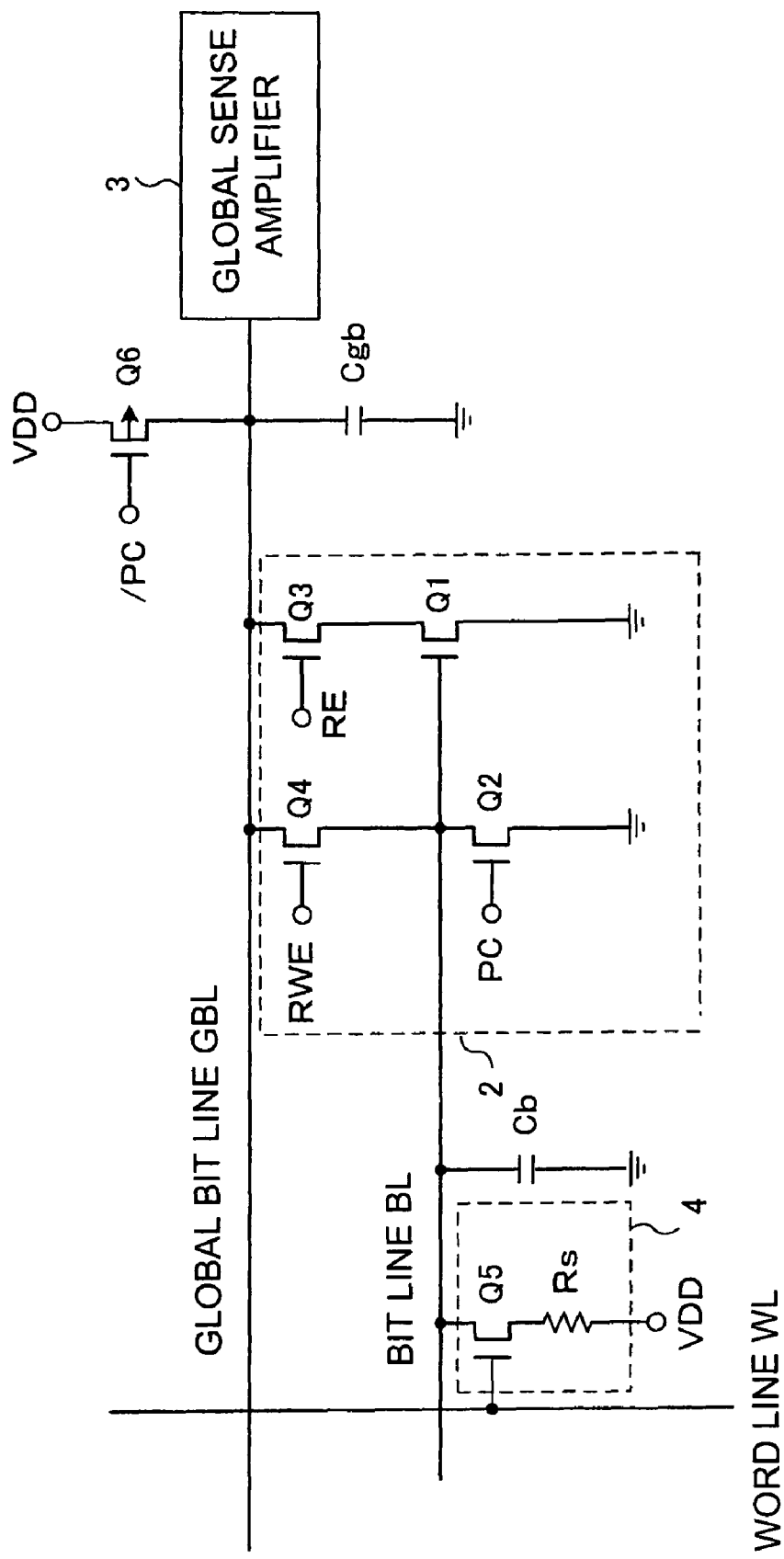
FIG. 10 is a diagram showing the structure of the resistance-change memory cell and sense amplifier according to Modification 1.

The capacitor-type memory cell shown in FIG. 2 is substituted with a resistance-change memory cell in the present modification, and FIG. 10 is a diagram showing the specific circuits of the resistance-change memory cell array and sense amplifier according to the present modification. The circuits are the same as in FIG. 2, except for the structure of the memory cell, and therefore only the differing parts will be described below.

As shown in FIG. 10, the memory cell 4 is composed of a selection nMOS transistor Q5, and a resistor element Rs for storing data on the basis of the size of a resistance value. The gate of the nMOS transistor Q5 is connected to the word line WL, the drain is connected to the bit line BL, and the source is connected to one terminal of the resistor element Rs. The other terminal of the resistor element Rs is connected to the power supply potential VDD.

A plurality of other memory cells not shown in the drawing is connected to the bit line BL, and as a result, the parasitic capacitance Cb of the bit line BL in the present embodiment is 10 fF, for example. Although not particularly limited, the lower limit Rs[H]min of the resistance distribution of the high-resistance state in the resistor element Rs of the present embodiment is 100 MΩ (mega-ohms), and the upper limit Rs[L]max of the resistance distribution of the low-resistance state is 100 KΩ (kilo-ohms). As a result, the time constant r of the system composed of the resistor element Rs and the bit line parasitic capacitance Cb is 1 μs (micro-second) or higher when the resistor element is in the high-resistance state, and 1 ns (nano-second) or lower when the resistor element is in the low-resistance state.

Consequently, during reading, since an adequate difference in the potential of the bit line BL several ns (nano-seconds) after the nMOS transistor Q5 turns on and the bit line BL begins charging and discharging is produced by the size of the resistance value of the resistor element, a sense amplification operation can be executed by the nMOS transistor Q1 with a margin by setting the sense period within this several ns. The number of memory cells connected to the bit line BL may be set to various numbers in accordance with the operating principle described above so that a parasitic capacitance computed in accordance with the resistance value of the memory cells and the planned duration of the sense period is obtained.

<Operational Waveform of the PVT Variation Compensation Sense Amplifier in which the Replica Delay Circuit for the RE Signal is Mounted when a Resistance-change Memory Cell is Used and there is No PVT Variation>

Figures 11A, 11B:
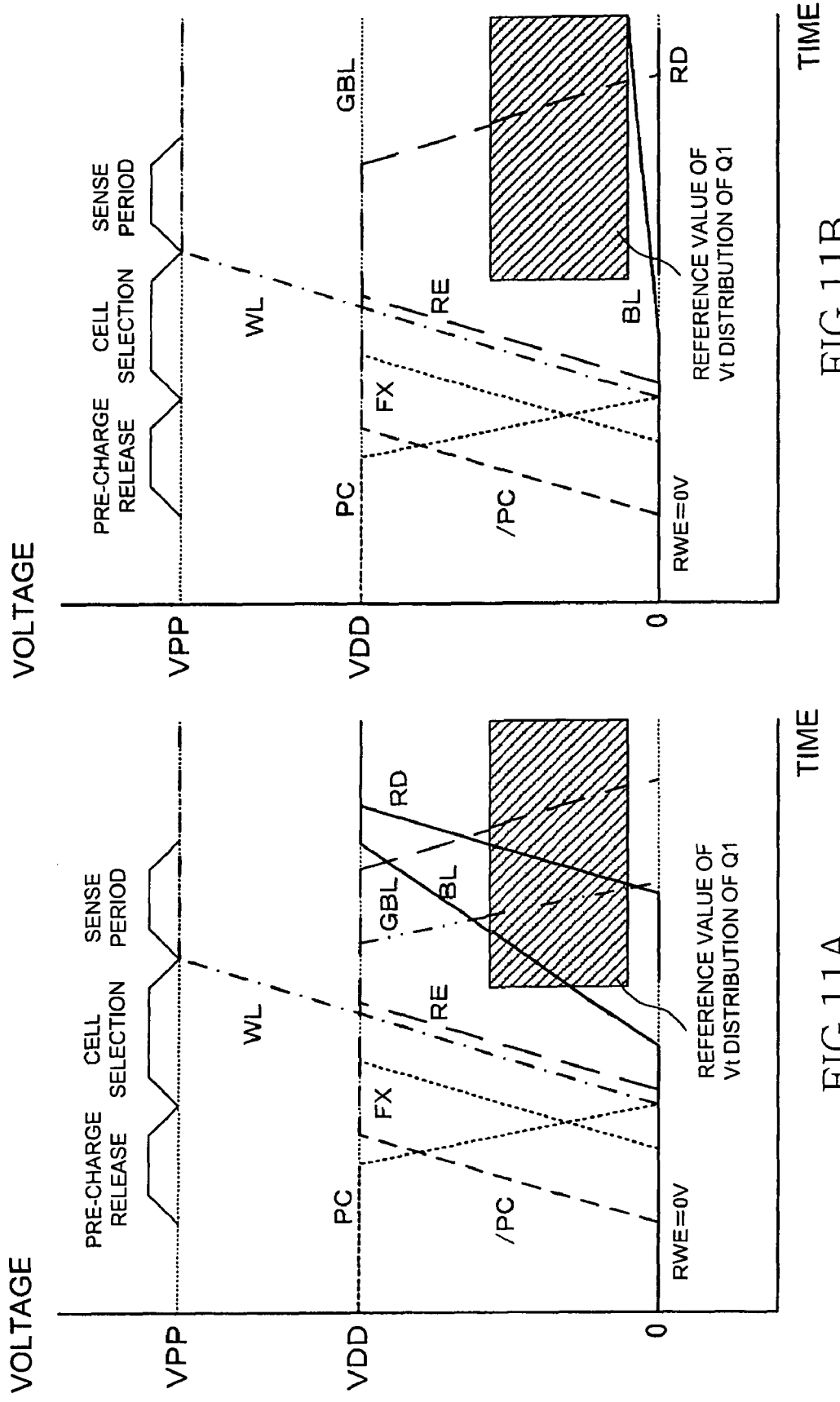
FIG. 11 is a diagram showing the operational waveform of the PVT variation compensation sense amplifier in which the RE signal replica delay circuit is mounted in a case in which the resistance-change memory cell according to Modification 1 is used, and there is no PVT variation.

FIG. 11 is a diagram showing the operational waveform during reading in a sense amplifier in which the replica delay circuit for the RE signal is mounted. The horizontal axis indicates time, and the vertical axis indicates voltage. FIG. 11A shows a case of reading a low-resistance state of the memory cell, and FIG. 11B shows a case of reading a high-resistance state. Except for the waveform of the signal voltage read to the bit line BL, the operation in FIG. 11 is the same as in FIG. 5, and operations that have already been described will not be described again.

In the case of reading a low resistance state, since the potential of the bit line in the sense period increases beyond the upper limit of the distribution of the threshold voltage Vt of the nMOS transistor Q1, the drain current of the nMOS transistor Q1 is large, and the charge that is charged by the parasitic capacitance Cgb of the global bit line GBL withdraws rapidly. The potential of the global bit line GBL is therefore rapidly discharged from VDD to the ground potential.

In the case of reading a high resistance state, since the potential of the bit line in the sense period remains lower than the lower limit of the distribution of the threshold voltage Vt of the nMOS transistor Q1, the drain current of the nMOS transistor Q1 does not flow, and the charge that is charged by the parasitic capacitance Cgb of the global bit line GBL does not withdraw. The potential of the global bit line GBL therefore stays at VDD.

<Operational Waveform of the PVT Variation Compensation Sense Amplifier in which the Replica Delay Circuit for the RE Signal is Mounted when a Resistance-change Memory Cell is Used and there is PVT Variation>

Figures 12A, 12B:
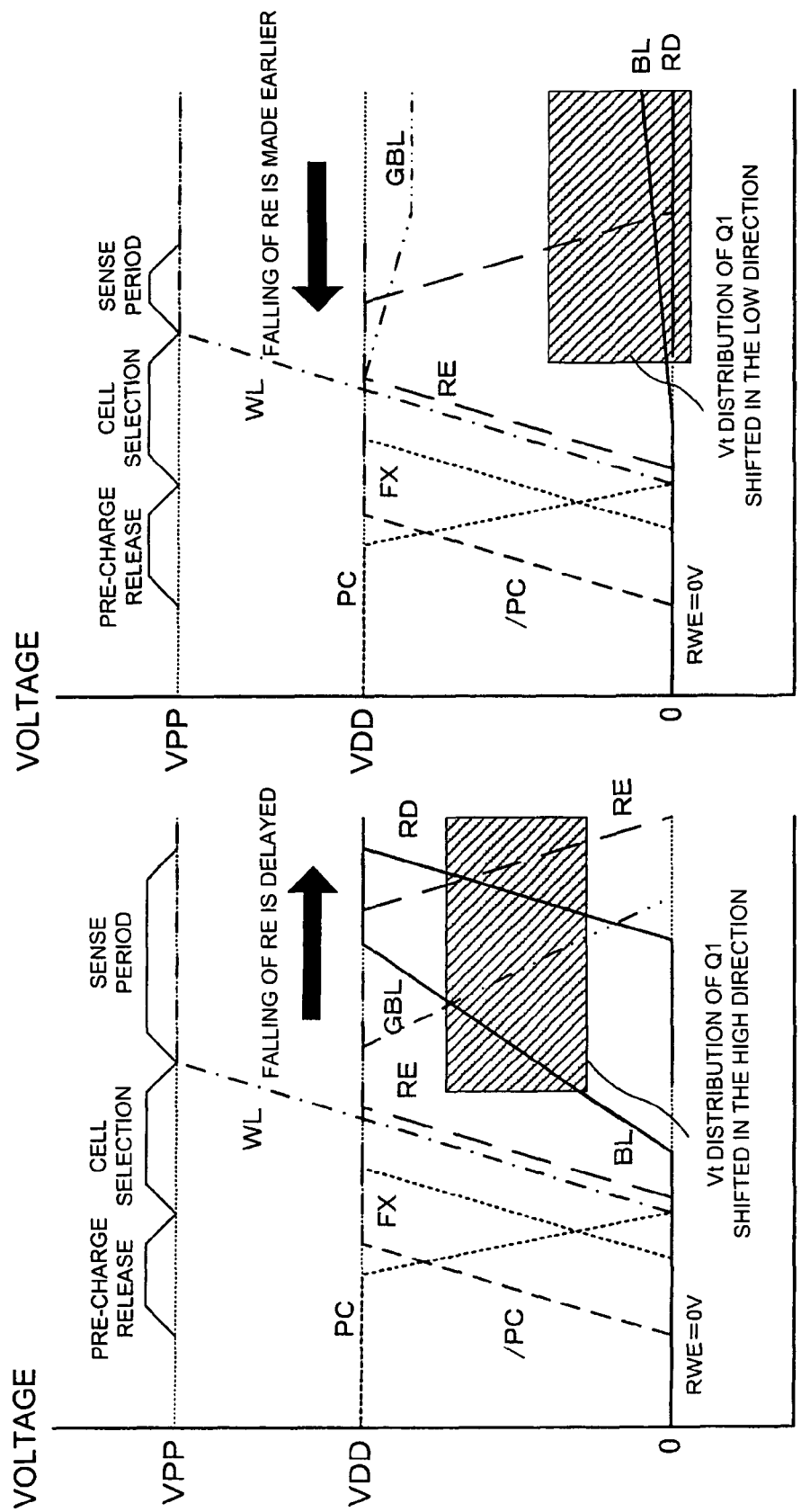
FIG. 12 is a diagram showing the operational waveform of the PVT variation compensation sense amplifier in which the RE signal replica delay circuit is mounted in a case in which the resistance-change memory cell according to Modification 1 is used, and there is PVT variation.

FIG. 12 is a diagram showing the operation when the Vt distribution of the nMOS transistor Q1 is shifted by PVT variation in the operational waveform during reading in the PVT compensation sense amplifier shown in FIG. 11. FIG. 12A shows a case of reading low-resistance state data of the memory cell 4 at the worst sense timing margin when Vt is shifted in the high direction. FIG. 12B shows a case of reading high-resistance state data at the worst sense timing margin when Vt is shifted in the low direction. Since the basic operation is the same as in FIG. 11, only the parts that differ will be described below.

When the Vt of the nMOS transistor Q1 is shifted in the high direction, and low-resistance state data are read, the potential of the bit line in the sense period surpasses the upper limit of the distribution of the threshold voltage Vt of the nMOS transistor Q1 at a later time. The drain current of the nMOS transistor Q1 therefore decreases, and the withdrawal rate of the charge that is charged by the parasitic capacitance Cgb of the global bit line GBL is reduced. As a result, since the rate at which the potential of the global bit line GBL is discharged from VDD to the ground potential is also low, the timing at which a determination of "low" is made by the global bit line voltage determination latch circuit is also delayed. At this time, since the timing at which RE changes to low is appropriately delayed by the replica delay circuit, RE changes to low after the global bit line voltage determination latch circuit makes a determination of "low." Consequently, reading of a low resistance state is correctly determined.

When the Vt of the nMOS transistor Q1 is shifted in the low direction, and high-resistance state data are read, since the potential of the bit line in the sense period is higher than the lower limit of the distribution of the threshold voltage Vt of the nMOS transistor Q1, the drain current of the nMOS transistor Q1 flows to a certain degree, and the charge that is charged by the parasitic capacitance Cgb of the global bit line GBL withdraws. As a result, the potential of the global bit line GBL is discharged from VDD to the ground potential, and the period in which a determination of "high" is made by the global bit line voltage determination latch circuit is shortened. At this time, since the timing at which RE changes to low is made appropriately early by the replica delay circuit, RE changes to low before an erroneous determination of "low" is made by the global bit line voltage determination latch circuit, and reading of a high resistance state is correctly determined.

<Operational Waveform of the PVT Variation Compensation Sense Amplifier in which the Replica Delay Circuit for the LTC Signal is Mounted when a Resistance-change Memory Cell is Used and there is No PVT Variation>

Figures 13A, 13B:
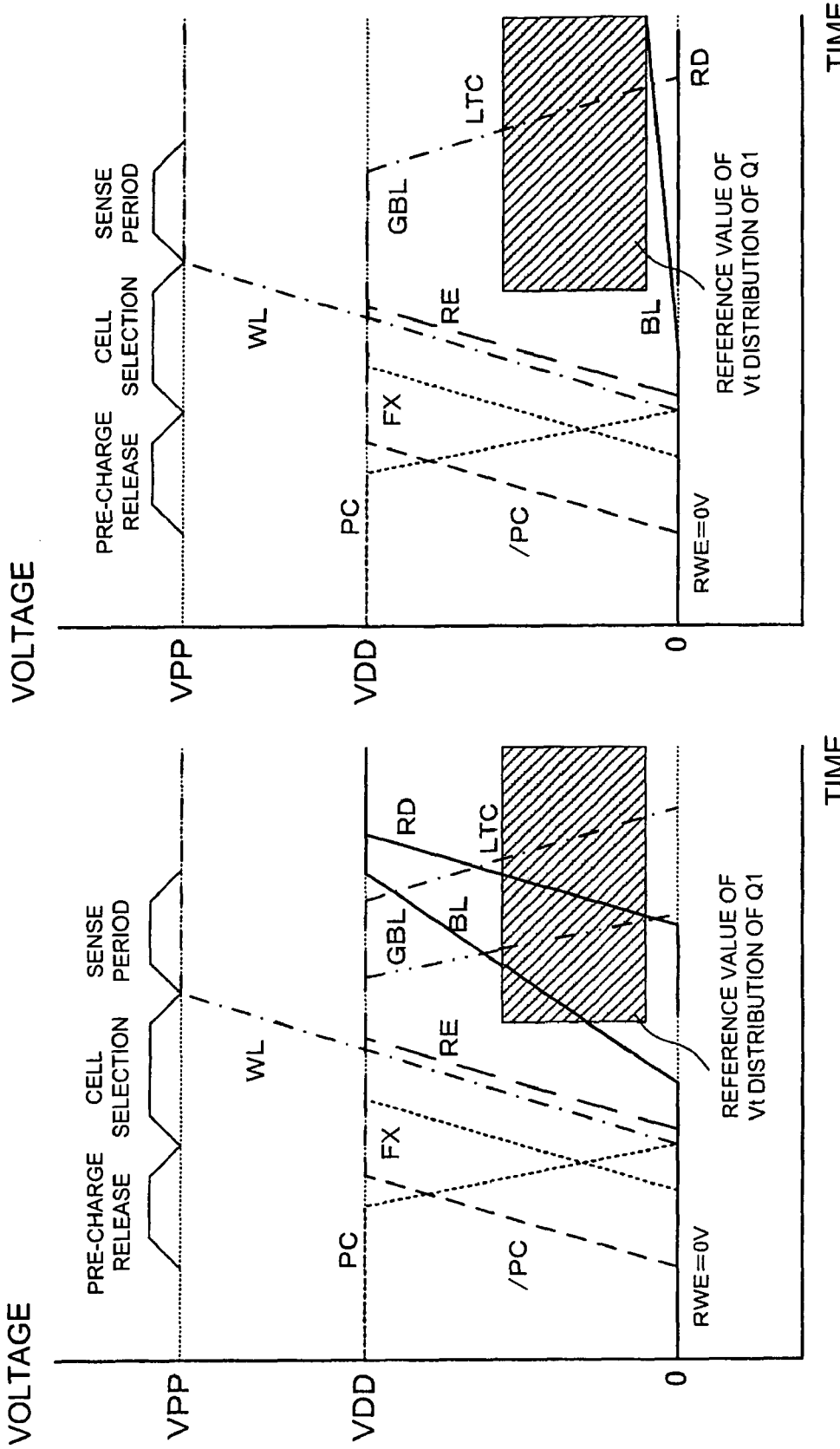
FIG. 13 is a diagram showing the operational waveform of the PVT variation compensation sense amplifier in which the LTC signal replica delay circuit is mounted in a case in which the resistance-change memory cell according to Modification 1 is used, and there is no PVT variation.

FIG. 13 is a diagram showing the operational waveform during reading in a sense amplifier in which the replica delay circuit for the LTC signal is mounted, in the case of a resistance-change memory cell. The horizontal axis indicates time, and the vertical axis indicates voltage. FIG. 13A shows a case of reading a low-resistance state of the memory cell, and FIG. 13B shows a case of reading a high-resistance state. Except for the waveform of the signal voltage read to the bit line BL, the operation in FIG. 13 is the same as in FIG. 8, and operations that have already been described will not be described again.

In the case of reading a low resistance state, since the potential of the bit line in the sense period increases beyond the upper limit of the distribution of the threshold voltage Vt of the nMOS transistor Q1, the drain current of the nMOS transistor Q1 is large, and the charge that is charged by the parasitic capacitance Cgb of the global bit line GBL withdraws rapidly. The potential of the global bit line GBL is therefore rapidly discharged from VDD to the ground potential.

In the case of reading a high resistance state, since the potential of the bit line in the sense period remains lower than the lower limit of the distribution of the threshold voltage Vt of the nMOS transistor Q1, the drain current of the nMOS transistor Q1 does not flow, and the charge that is charged by the parasitic capacitance Cgb of the global bit line GBL does not withdraw. The potential of the global bit line GBL therefore stays at VDD.

<Operational Waveform of the PVT Variation Compensation Sense Amplifier in which the Replica Delay Circuit for the LTC Signal is Mounted when a Resistance-change Memory Cell is Used and there is PVT Variation>

FIG. 14 is a diagram showing the operation when the Vt distribution of the nMOS transistor Q1 is shifted by PVT variation in the operational waveform during reading in the PVT compensation sense amplifier shown in FIG. 13. FIG. 14A shows a case of reading low-resistance state data of the memory cell at the worst sense timing margin when Vt is shifted in the high direction. FIG. 14B shows a case of reading high-resistance state data at the worst sense timing margin when Vt is shifted in the low direct-ion. Since the basic operation is the same as in FIG. 13, only the parts that differ will be described below.

When the Vt of the nMOS transistor Q1 is shifted in the high direction, and low-resistance state data are read, since the timing at which LTC changes to low is appropriately delayed by the replica delay circuit, LTC changes to low after the global bit line voltage determination latch circuit makes a determination of "low," and reading of a low resistance state is correctly determined. When the Vt of the nMOS transistor Q1 is shifted in the low direction, and high-resistance state data are read, since the timing at which LTC changes to low is made appropriately early by the replica delay circuit, LTC changes to low before an erroneous determination of "low" is made by the global bit line voltage determination latch circuit, and reading of a high resistance state is correctly determined.

As described above, a resistance-change memory cell has high resistance of several hundred KΩ even in the low resistance state, and the amplitude of the read voltage is therefore reduced by the effects of bit line capacitance and the like. The operating margin of the sense amplifier is further reduced when there is PVT variation. However, through the present modification, the PVT variation dependence of the latch for determining the global bit line voltage in the global sense amplifier, or the MOS transistor for memory cell selection is monitored, and variations due to dependence thereof are compensated for. The operating margin of the sense amplifier can therefore be prevented from decreasing even when the memory cell is a resistance-change memory cell.

<Modification 2>

Figure 15:
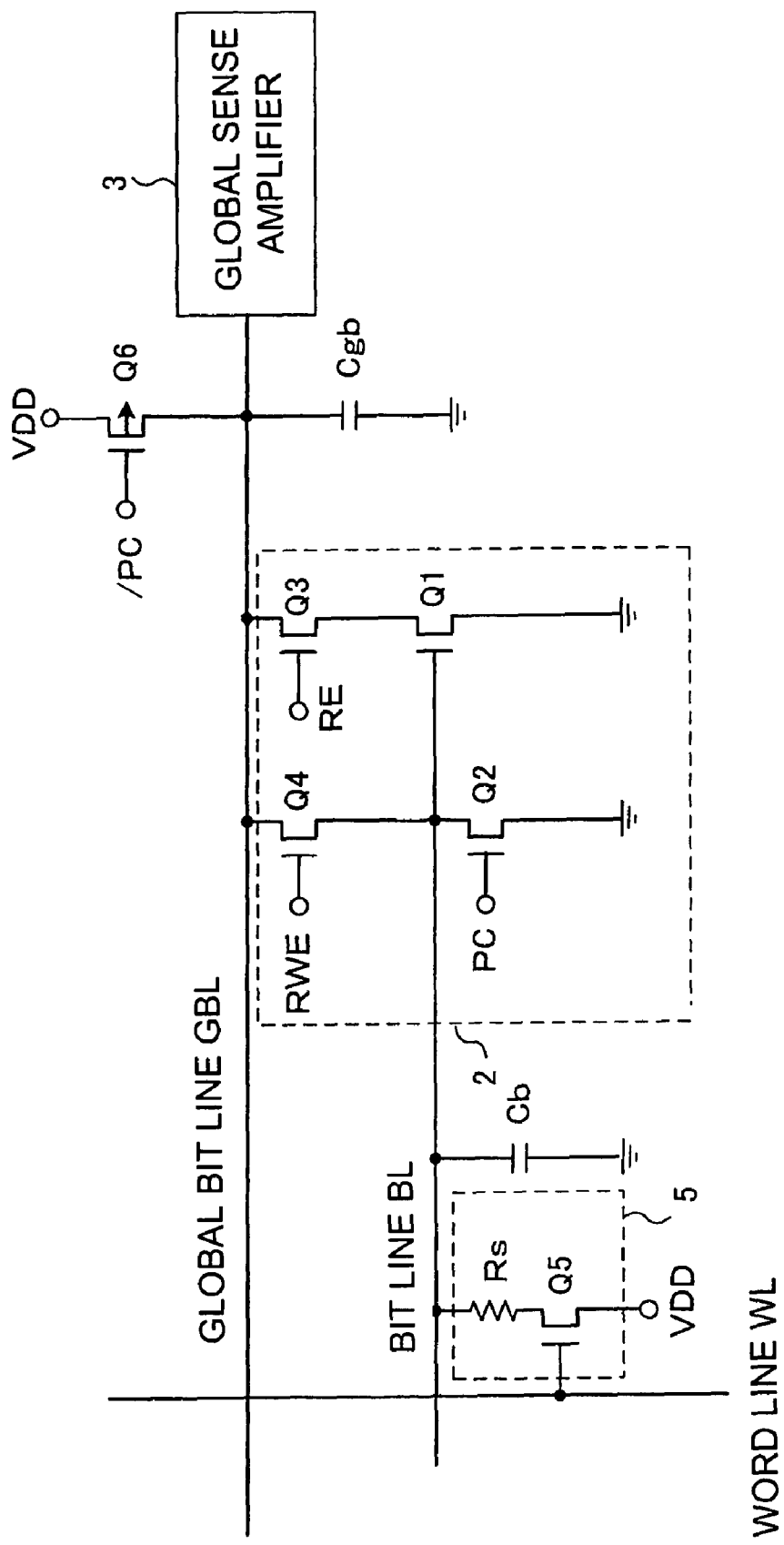
FIG. 15 is a diagram showing the structure of the resistance-change memory cell and sense amplifier according to Modification 2.

FIG. 15 is a diagram showing a memory cell 5 that includes a modification of a resistance-change memory cell as a memory cell, and the sense amplifier circuits 2 in the disclosure. Since the basic structure is the same as in FIG. 10, only the memory cell portion will be described, and parts that are the same will not be described.

The memory cell 5 is composed of a selection nMOS transistor Q5, and a resistor element Rs for storing data by the size of a resistance value. The gate of the nMOS transistor Q5 is connected to the word line WL, the drain is connected to one terminal of the resistor element Rs, and the source is connected to the power supply potential VDD. The other terminal of the resistor element Rs is connected to the bit line BL.

<Modification 3>

Figure 16:
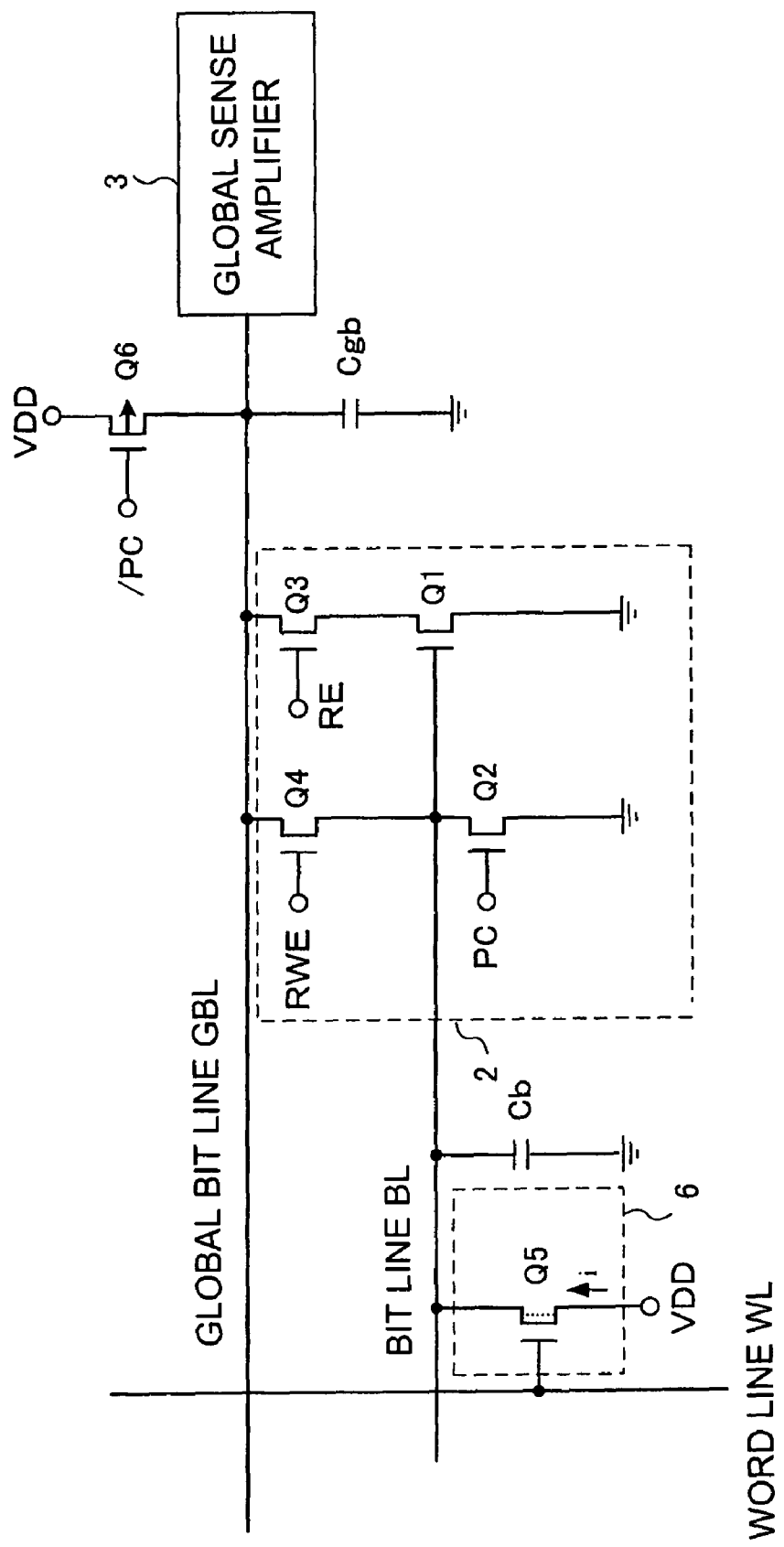
FIG. 16 is a diagram showing the structure of the resistance-change memory cell and sense amplifier according to Modification 3.

FIG. 16 is a diagram showing a memory cell 6 that includes a modification of a resistance-change memory cell as a memory cell, and the circuits of the sense amplifier 2 in the disclosure. Since the basic structure is the same as in FIG. 10, only the memory cell portion will be described, and parts that are the same will not be described.

The nMOS transistor Q5 for memory cell selection has a floating-body structure, the gate of the nMOS transistor Q5 is connected to the word line WL, the source is connected to the power supply potential VDD, and the drain is connected to the bit line BL. In a state in which holes are accumulated in the floating body, the threshold voltage Vt of the nMOS transistor Q5 decreases, and the "on" resistance decreases. The lower limit i(H)min of the "on" current at this time is 10 uA, for example. When holes are not accumulated in the floating body of the nMOS transistor Q5, the threshold voltage Vt of the nMOS transistor Q5 increases, and the "on" resistance increases as well. The upper limit i(L)max of the "on" current at this time is 10 nA (nano-amps or nano-amperes), for example.

Since the current flowing through the resistor element in operation of the memory cells shown in FIGS. 11, 12, 13, and 14 is substantially equal to the "on" current of the nMOS transistor Q5 in the modification described above, operation using the memory cell of the modification is possible using substantially the same control method as shown in FIGS. 11, 12, 13, and 14.

When the memory cell is composed of a floating-body MOS transistor as in the present modification, the threshold voltage Vt of the MOS transistor varies according to the state of accumulation of holes in the floating body. Consequently, the operating margin of the sense amplifier is reduced by PVT variation of the MOS transistor. However, since the PVT variation dependence of the memory cell selection MOS transistor is monitored, and the variation due to dependence is also compensated for in the present modification, the operating margin of the sense amplifier can be prevented from decreasing even when the memory cell is composed of a floating-body MOS transistor.

<Modification 4>

Figure 17:
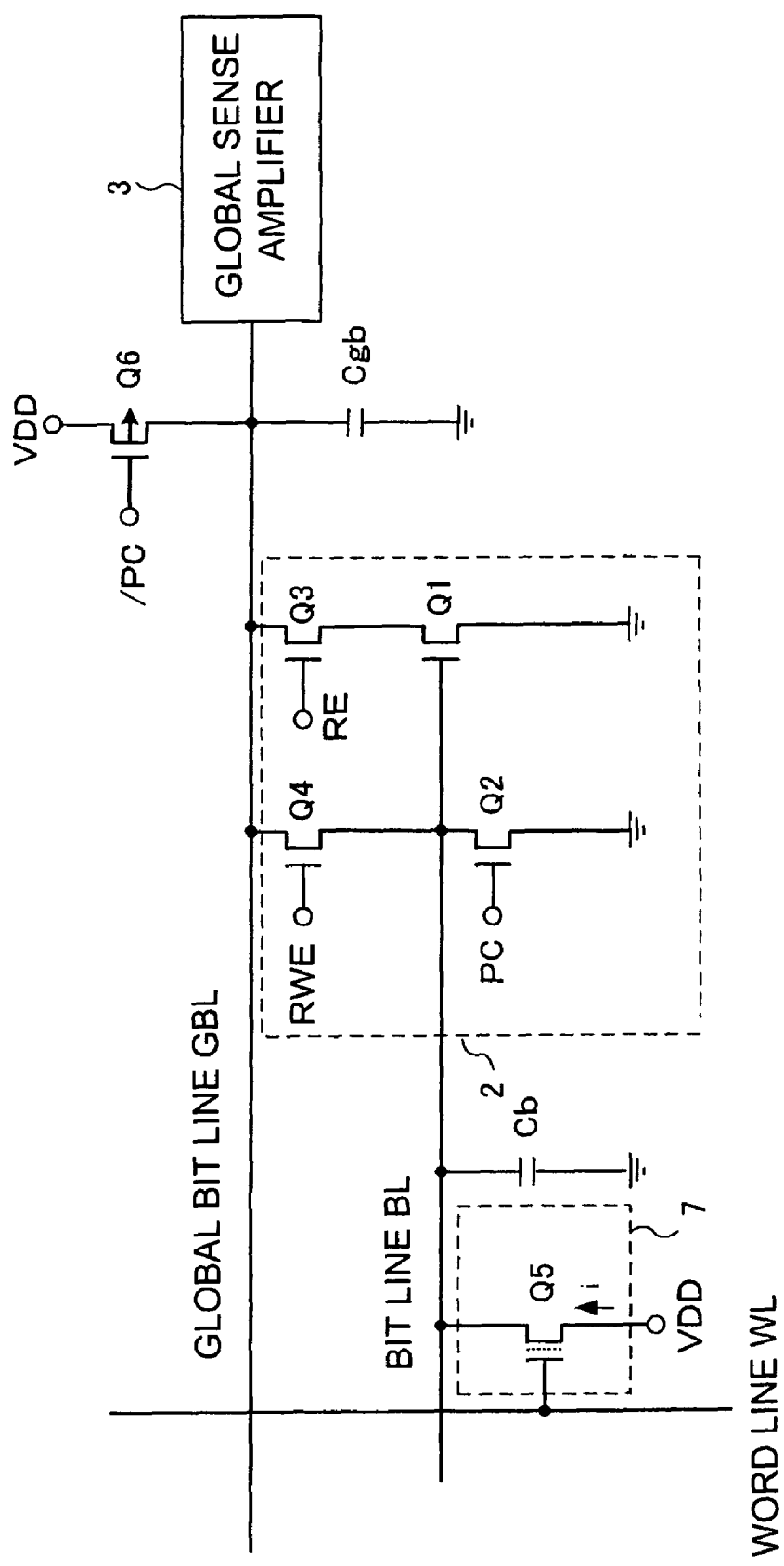
FIG. 17 is a diagram showing the structure of the resistance-change memory cell and sense amplifier according to Modification 4.

FIG. 17 is a diagram showing the circuits of a sense amplifier and a memory cell that includes a modification of a resistance-change memory cell as the memory cell in the disclosure. Since the basic structure is the same as in FIG. 10, only the memory cell portion will be described, and parts that are the same will not be described.

The memory cell 7 is composed of an nMOS transistor Q5 in which a charge trap region is provided in a gate insulation film, and information is stored according to a state in which electrons are accumulated in the charge trap region of the nMOS transistor Q5, and a state in which electrons are not accumulated in the charge trap region of the nMOS transistor Q5. The gate of the nMOS transistor Q5 is connected to the word line WL, the source is connected to the power supply potential VDD, and the drain is connected to the bit line BL.

In the state in which electrons are not accumulated in the charge trap region of the nMOS transistor Q5, the threshold voltage Vt of the nMOS transistor Q5 decreases, and the "on" resistance decreases. The lower limit i(H)min of the "on" current at this time is 10 uA, for example. When electrons are accumulated in the charge trap region of the nMOS transistor Q5, the threshold voltage Vt of the nMOS transistor Q5 increases, and the "on" resistance increases as well. The upper limit i(L)max of the "on" current at this time is 10 nA, for example.

Since the current flowing through the resistor element in operation of the memory cells shown in FIGS. 11, 12, 13, and 14 is substantially equal to the "on" current of the nMOS transistor Q5 in the modification described above, operation using the memory cell of the modification is possible using substantially the same control method as shown in FIGS. 11, 12, 13, and 14.

When the memory cell is composed of a MOS transistor in which a charge trap region is provided in a gate insulation film as in the present modification, the threshold voltage Vt of the MOS transistor changes according to the state of accumulation of electrons in the charge trap region. Consequently, the operating margin of the sense amplifier is reduced by PVT variation of the MOS transistor. However, since the PVT variation dependence of the memory cell selection MOS transistor is monitored, and the variation due to dependence is also compensated for in the present modification, the operating margin of the sense amplifier can be prevented from decreasing even when the memory cell is composed of a MOS transistor in which a charge trap region is provided in a gate insulation film.

<Modification 5>

Figure 18:
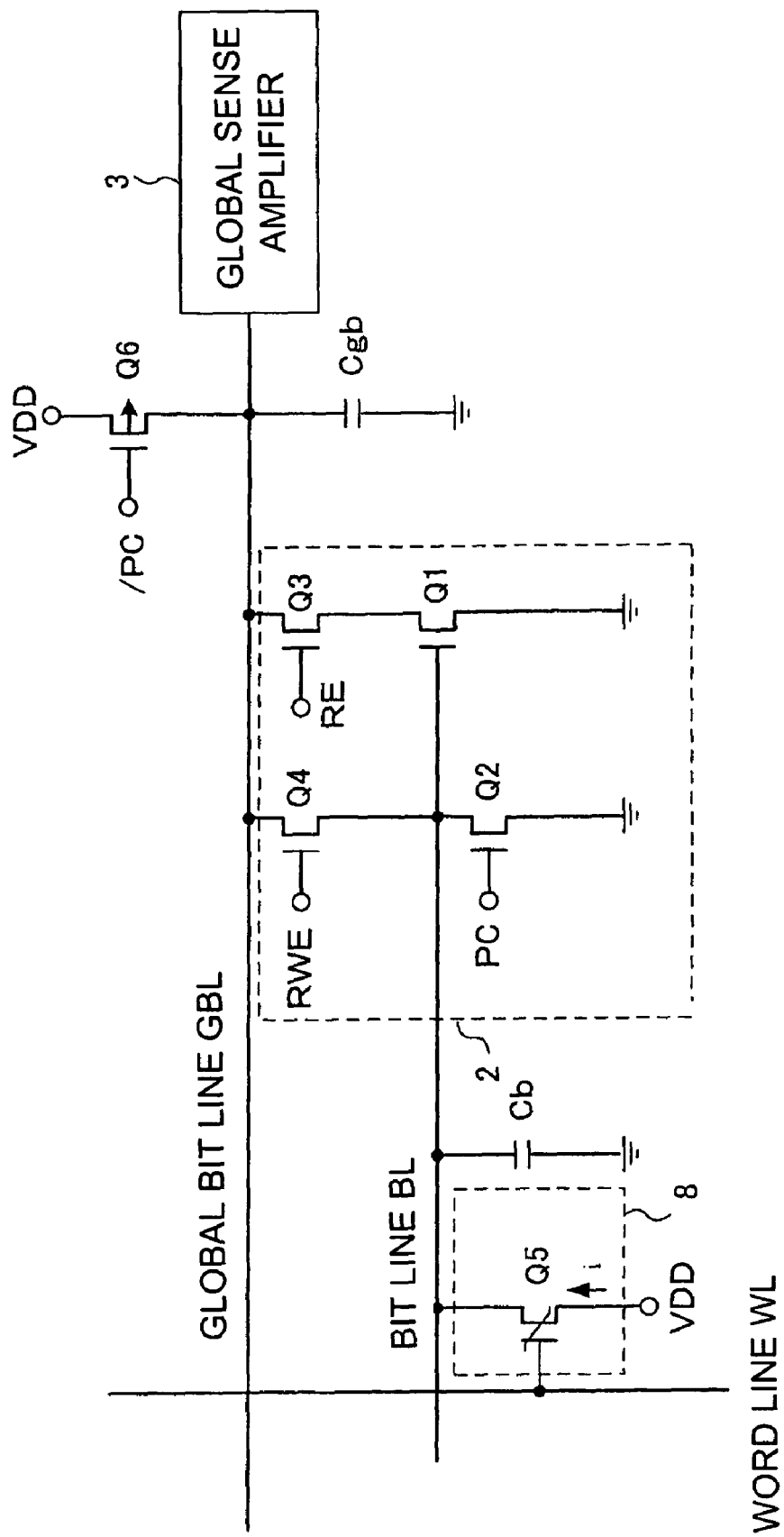
FIG. 18 is a diagram showing the structure of the resistance-change memory cell and sense amplifier according to Modification 5.

FIG. 18 is a diagram showing the circuits of a sense amplifier 2 and a memory cell 8 that includes a modification of a resistance-change memory cell as the memory cell in the disclosure. Since the basic structure is the same as in FIG. 10, only the memory cell portion will be described, and parts that are the same will not be described.

The memory cell 8 is composed of an nMOS transistor Q5 having a structure in which a ferroelectric is used in a gate insulation film, and information is stored according to the direction of polarization of the ferroelectric film. The gate of the nMOS transistor Q5 is connected to the word line WL, the source is connected to the power supply potential VDD, and the drain is connected to the bit line BL.

When the polarization direction of the ferroelectric film of the nMOS transistor Q5 is in a state in which the channel side is positive, the threshold voltage Vt of the nMOS transistor Q5 decreases, and the "on" resistance decreases as well. The lower limit i(H)min of the "on" current at this time is 10 uA, for example. When the polarization direction of the ferroelectric film of the nMOS transistor Q5 is in a state in which the channel side is negative, the threshold voltage Vt of the nMOS transistor Q5 increases, and the "on" resistance increases as well. The upper limit i(L)max of the "on" current at this time is 10 nA, for example.

Since the current flowing through the resistor element in operation of the memory cells shown in FIGS. 11, 12, 13, and 14 is substantially equal to the "on" current of the nMOS transistor Q5 in the modification described above, operation using the memory cell 8 of the modification is possible using substantially the same control method as shown in FIGS. 11, 12, 13, and 14.

When the memory cell is composed of a MOS transistor in which a ferroelectric is used in a gate insulation film as in the present modification, the "on" resistance of the MOS transistor varies according to whether the polarization direction of the ferroelectric film is such that the channel side is positive or negative. Consequently, the operating margin of the sense amplifier is reduced by PVT variation of the MOS transistor. However, since the PVT variation dependence of the memory cell selection MOS transistor is monitored, and the variation due to dependence is also compensated for in the present modification, the operating margin of the sense amplifier can be prevented from decreasing even when the memory cell is composed of a MOS transistor in which a ferroelectric is used in a gate insulation film.

The sense circuit according to the present embodiment compensates for the manufacturing process, the power supply voltage, the junction temperature, and other factors that cause variation as described above. Since the operating margin of the sense circuit is thereby enhanced, and the sense operation of the memory is stabilized, the sense circuit can also be used in a highly precise data processing system or the like.

Embodiments of the disclosure were described in detail above with reference to the accompanying drawings, but the specific configuration of the disclosure is not limited by the embodiments, and the disclosure also encompasses designs and the like in ranges that do not depart from the intended scope of the disclosure.

For example, the polarities of the MOS transistors were configured as described above in the present embodiments, but it is also possible to form a circuit in which the polarities of the MOS transistors are all reversed. In this case, the relationship of the power supply potential and the ground is reversed, and the polarity of the control signal is also reversed.

Moreover, it will thus be appreciated that the embodiments described above are cited by way of example, and that the present disclosure is not limited to what has been particularly shown and described hereinabove. Rather, the scope of the present disclosure includes both combinations and subcombinations of the various features described hereinabove, as well as variations and modifications thereof which would occur to persons skilled in the art upon reading the foregoing description. The language of "present invention" or "invention" in this application and prosecution should not be improperly interpreted as limiting the scope of the application or claims.

What is claimed is:

1. A semiconductor device comprising:
    a single-ended sense amplifier including a first field-effect transistor for amplifying a signal supplied to a bit line from a memory cell, a second field-effect transistor for supplying an output signal of the first field-effect transistor to a global bit line, and a global bit line voltage determination circuit; and
    a control circuit for controlling at least one of a timing at which the second field-effect transistor transitions from a conducting state to a non-conducting state and a read timing of a global sense amplifier that includes the global bit line voltage determination circuit, based on an output signal of a delay circuit that includes a replica of the first field-effect transistor and a replica of the global bit line voltage determination circuit.

2. The semiconductor device as claimed in claim 1, wherein the delay circuit further includes a replica of a third field-effect transistor for selecting the memory cell.

3. The semiconductor device as claimed in claim 1, wherein the delay circuit further includes a replica of the second field-effect transistor.

4. The semiconductor device as claimed in claim 1, wherein
the delay circuit further includes a replica of a third field-effect transistor for selecting the memory cell, and a replica of the second field-effect transistor,
an output of the replica of the third field-effect transistor is supplied to the replica of the first field-effect transistor,
an output of the replica of the first field-effect transistor is supplied to the replica of the second field-effect transistor, and
an output of the replica of the second field-effect transistor is supplied to the replica of the global bit line voltage determination circuit.

5. The semiconductor device as claimed in claim 1, wherein the delay circuit further includes a replica of a capacitance of the bit line.

6. The semiconductor device as claimed in claim 1, wherein the delay circuit further includes a replica of a capacitance of the global bit line.

7. The semiconductor device as claimed in claim 4, wherein
the delay circuit further includes a replica of a capacitance of the bit line and a replica of a capacitance of the global bit line,
the replica of the capacitance of the bit line is connected to the replica of the third field-effect transistor, and
the replica of the capacitance of the global bit line is connected to the replica of the second field-effect transistor.

8. The semiconductor device as claimed in claim 1, wherein the memory cell includes a capacitor and a field-effect transistor.

9. The semiconductor device as claimed in claim 1, wherein the memory cell includes a resistor and a field-effect transistor.

10. The semiconductor device as claimed in claim 1, wherein the memory cell includes a floating-body field-effect transistor.

11. The semiconductor device as claimed in claim 1, wherein the memory cell includes a field-effect transistor in which a charge trap region is provided in a gate insulating film.

12. The semiconductor device as claimed in claim 1, wherein the memory cell includes a field-effect transistor including a ferroelectric material in a gate insulating film.

13. The semiconductor device as claimed in claim 1, wherein
the sense amplifier further includes a fourth field-effect transistor for supplying an output of the global bit line voltage determination circuit to the global bit line, and a fifth field-effect transistor for supplying data on the global bit line to the bit line, and
the fourth field-effect transistor and the fifth field-effect transistor are field-effect transistors for one of writing read data of the output of the global bit line voltage determination circuit, and writing write data from outside of the semiconductor device to the memory cell.

14. A semiconductor device comprising:
a memory element for storing information;
a first field-effect transistor for connecting the memory element to a bit line;
a second field-effect transistor that works as a single-ended sense amplifier including a gate connected to the bit line for amplifying a data signal on the bit line;
a third field-effect transistor connected to the second field-effect transistor for supplying an output signal of the second field-effect transistor to a global bit line;
a global bit line voltage determination circuit connected to the global bit line for determining a signal on the global bit line;
a delay circuit that includes a replica of the second field-effect transistor and a replica of the global bit line voltage determination circuit; and
a control circuit for controlling at least a timing at which the third field-effect transistor transitions from a conducting state to a non-conducting state based on an output signal of the delay circuit.

15. The semiconductor device as claimed in claim 14, wherein
the global bit line voltage determination circuit includes a fourth field-effect transistor for connecting the global bit line and an input node of the global bit line voltage determination circuit, and
the control circuit controls a timing at which the fourth field-effect transistor transitions from a conducting state to a non-conducting state based on the output signal of the delay circuit.

16. The semiconductor device as claimed in claim 15, wherein
the global bit line voltage determination circuit further includes a fifth field-effect transistor for connecting the global bit line and an output node of the global bit line voltage determination circuit, and
the global bit line voltage determination circuit writes data information of the global bit line voltage determination circuit to the global bit line by a transition of the fifth field-effect transistor from a non-conducting state to a conducting state after the fourth field-effect transistor has transitioned from a conducting state to a non-conducting state.

17. The semiconductor device as claimed in claim 15, further comprising a sixth field-effect transistor connected between the global bit line and the bit line for writing data to the memory element; wherein
the voltage of the global bit line is transitioned by the writing of the global bit line voltage determination circuit from the voltage of the global bit line when the fourth field-effect transistor was in a conducting state to a rewriting data voltage that indicates a different inverted voltage.

18. The semiconductor device as claimed in claim 14, further comprising a fifth field-effect transistor for connecting the global bit line and an output node of the global bit line voltage determination circuit, wherein
the global bit line voltage determination circuit comprises:
a fourth field-effect transistor for connecting the global bit line and an input node of the global bit line voltage determination circuit;
a seventh field-effect transistor for connecting the input node of the global bit line voltage determination circuit and a write data line from outside; and
a sixth field-effect transistor for connecting the global bit line and the bit line, and writing data to the memory element, wherein
the fourth field-effect transistor is in a non-conducting state, and the seventh field-effect transistor, the fifth field-effect transistor and the sixth field-effect transistor are all in a conducting state at the time of writing, whereby the write data of the global bit line voltage determination circuit are written to the memory element via the global bit line and the bit line.

19. The semiconductor device as claimed in claim 14, wherein the delay circuit further includes a replica of the first field-effect transistor and a replica of the third field-effect transistor.

20. The semiconductor device as claimed in claim 14, wherein
the delay circuit further includes a replica of the first field-effect transistor and a replica of the third field-effect transistor,
an output of the replica of the first field-effect transistor is supplied to the replica of the second field-effect transistor,
an output of the replica of the second field-effect transistor is supplied to the replica of the third field-effect transistor, and
an output of the replica of the third field-effect transistor is supplied to the replica of the global bit line voltage determination circuit.

21. A semiconductor device comprising:
a sense amplifier comprising:
a first transistor for amplifying a signal supplied to a first signal line from a memory unit;
a second transistor for supplying an output signal of the first transistor to a second signal line; and
a voltage determination circuit for the second signal line; and
a control unit for controlling a timing at which the second transistor transitions from a conducting state to a non-conducting state, and controlling a read timing of a second sense amplifier that includes the voltage determination circuit for the second signal line, based on an output signal of a delay circuit that includes a third transistor and a second voltage determination circuit of the second signal line, where the third transistor is substantially the same as the first transistor, and the second voltage determination circuit is substantially the same as the first voltage determination circuit for the second signal line.

22. The semiconductor device as claimed in claim 21, wherein the delay circuit further comprises a fourth transistor for selecting the memory unit, and a capacitance substantially the same as the capacitance of one of the first signal line and second signal line.

23. The semiconductor device as claimed in claim 21, wherein the sense amplifier further comprises a fourth transistor for supplying an output of the voltage determination circuit to the second signal line.

24. The semiconductor device as claimed in claim 21, wherein the sense amplifier further comprises a fifth transistor for supplying data on the second signal line to the first signal line, and the fifth transistor writes read data of the output of the line voltage determination circuit, and write external data to the memory unit.

* * * * *